United States Patent [19]
Gill et al.

[11] Patent Number: 5,388,032
[45] Date of Patent: Feb. 7, 1995

[54] COMPUTER EQUIPMENT MONITOR AND DISCRIMINATOR

[75] Inventors: Daniel A. Gill, Ramona; Karl Brown, San Diego, both of Calif.

[73] Assignee: IBUS Technologies, Inc., San Diego, Calif.

[21] Appl. No.: 57,532

[22] Filed: May 4, 1993

[51] Int. Cl.[6] ............................................. H05K 7/16
[52] U.S. Cl. ................................... 364/146; 364/138; 364/188; 361/680; 361/681; 361/727
[58] Field of Search ............... 364/138, 140, 146, 188, 364/708.1; 381/331, 390; 361/680, 681, 726, 725, 727; 248/917–923; 358/254; 345/905

[56] References Cited

U.S. PATENT DOCUMENTS

| | | | |
|---|---|---|---|
| 5,128,829 | 7/1992 | Loew | 364/708 |
| 5,161,028 | 11/1992 | Kawata et al. | 358/254 |
| 5,173,686 | 12/1992 | Fujihara | 248/920 |
| 5,175,672 | 12/1992 | Conner et al. | 361/681 |
| 5,187,641 | 2/1993 | Muskatello et al. | 361/680 |

OTHER PUBLICATIONS

Sales Brochure, DEI, Lantender System, date unknown.
Sales Catalogue, Sales Brochure and Sales Letter, Raritan Computer, Inc., Masterconsole, 9 pps., Jun., 1993.
Brochure of Recortec, Inc., RMM–235 VGA Color Monitor; RMM–236 Multi–Scan Color Monitor, date unknown.
Sales Catalogue offering OEM 9" VGA Monitor, p. 72, date and source unknown.
Sales Brochure, IBUS PC Technologies, BERMM TM, 1993.
Advertisement in Byte, *Your Choice of Keyboard Monitor Switches*, p. 214, Nov., 1992.
Sales Catalogue, Cubix Corporation, Cabinet Mux, p. 5, Mar., 1993.
Sales Catalogue, Cubix Corporation, Video and Keyboard Switching Products, p. 7, Mar., 1993.
Computer Select (Law version) Jan. 1992. Document #96320 Cybex Corporation.

*Primary Examiner*—Emanuel T. Voeltz
*Assistant Examiner*—Craig Steven Miller
*Attorney, Agent, or Firm*—Knobbe, Martens, Olson & Bear

[57] ABSTRACT

An apparatus system, and method for monitoring a plurality of computers in an electronic equipment rack, are provided having a display, a keyboard and a discriminator. The discriminator is responsive to a selector input device which is used by an operator to select one computer of the plurality of computers which requires monitoring. The discriminator selectively connects the selected computer to the keyboard and the display. In one preferred embodiment, a monitoring device is disclosed having a storage drawer slidably mountable within the equipment rack, a display, pivotably connected to the storage drawer, a keyboard, removably mounted to the storage drawer, and a discriminator device for selecting one of the plurality of computers within the rack. The maximum vertical height of the storage drawer and monitoring components is 1 retma unit.

33 Claims, 8 Drawing Sheets

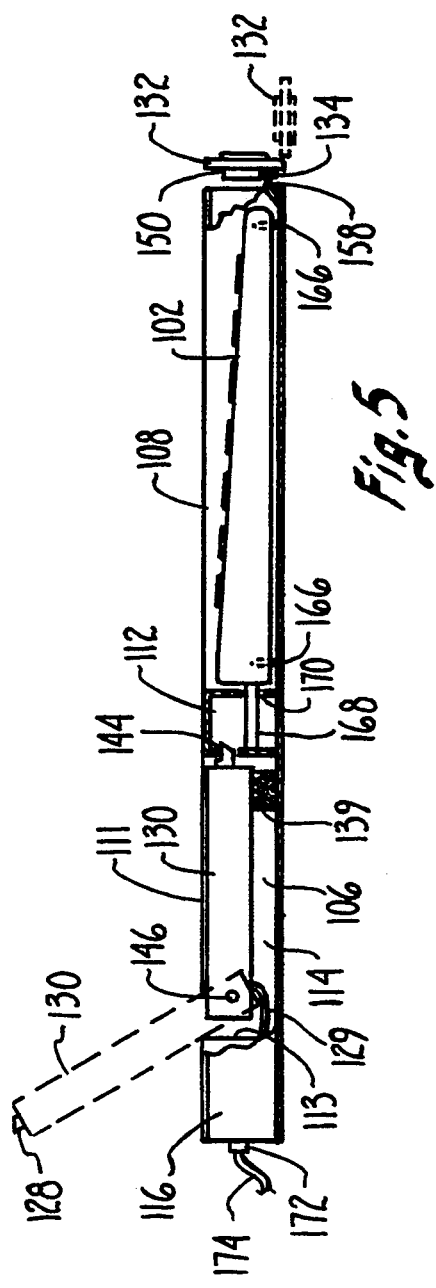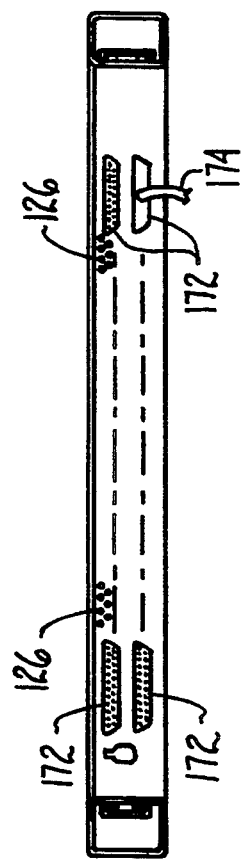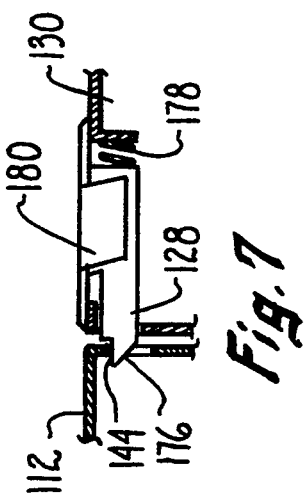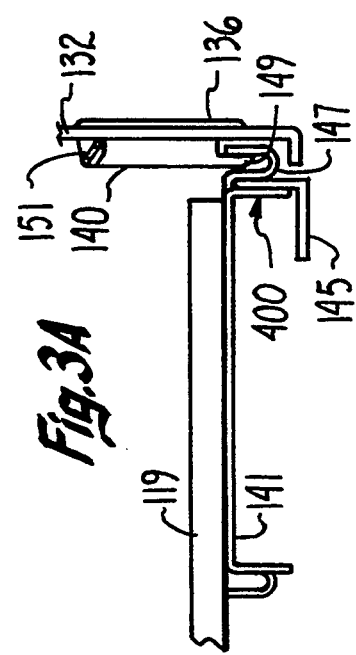

COMPUTER EQUIPMENT MONITOR AND DISCRIMINATOR

BACKGROUND OF THE INVENTION

The present invention relates to devices for monitoring computer equipment, computer peripherals, telephone computer systems, medical instrumentation systems, and other electronic instruments requiring monitoring, and more particularly, but not by way of limitation, to a low profile device for monitoring computer equipment and discriminating between the computers to be monitored.

Virtually all computer systems, especially those used in imbedded applications such as telecommunication, voice processing, and medical instrumentation systems, require some type of monitoring. Computers must be capable of communicating with human operators so that their operation can be monitored. Typically, the operator uses a display and a keyboard to monitor a selected computer. Therefore, typically the computers have interfaces capable of accommodating standard keyboard input signals and display output signals. In order to monitor the operation of any selected computer, a human operator typically inserts a keyboard jack means and a display jack means into the appropriate interface for the selected computer. The operator then issues commands via keystrokes on the keyboard to the selected computer and the selected computer responds by sending signals which control the display.

In typical imbedded application environments, there is preciously little space available for storing computer equipment and related monitoring devices. For example, many system integrators mount multiple computers in a single EIA RS-310 standard 19-inch rack. Typically, the available rack space is extremely limited and in many cases non-existent. Although there is very little space available for rack-mounted monitors, the monitors are necessary for performing software revision, maintenance, and diagnostic functions. Because space in the 19-inch rack is typically at a premium, and lost rack space often equates to lost revenue, it is important that the computer monitoring equipment occupy as little rack space as possible. Furthermore, because typical computer systems utilize several computers performing a diverse set of functions, it is important that the computer monitoring equipment be flexible in order to accommodate different computer systems. Thus, several computer monitoring solutions are presently available. However, each suffers from a variety of defects.

Dedicated rack-mounted monitors and keyboards are used in environments where either there is sufficient available rack space or where the system monitoring requirements justify sacrificing rack space for monitors. For example, telecommunication and medical instrumentation systems typically must be highly reliable and therefore require constant monitoring. These systems typically house their computer equipment within the EIA RS-310 standard 19-inch rack. The dedicated rack-mounted monitor is typically housed in the same equipment rack as the computers it monitors. However, the dedicated rack-mounted monitors typically occupy at least 7 retma units (7-U) or about 12.25 inches of vertical rack space. In addition, the dedicated rack-mounted keyboards typically occupy at least 1 retma unit (1-U) or about 1.75 inches of vertical rack space. The loss of valuable rack space therefore represents a serious defect. Moreover, this defect is magnified in environments where the monitors are frequently idle and used only during system failures.

In addition, the dedicated rack-mounted monitors of the prior art provide an inflexible and inconvenient solution. The dedicated monitors typically communicate with only one computer at a time. Therefore, in order to monitor an entire rack of computers, there are two possible solutions, neither of which is preferable. Either each computer in the rack has its own dedicated display and keyboard, or one rack-mounted display and keyboard is provided and repeatedly connected and re-connected to each computer requiring monitoring. The former solution is prohibitively expensive. The latter solution is inconvenient. As discussed hereinabove, each computer in the rack typically has a standard keyboard and a standard display interface. Occasionally the interfaces are accessible from the front of the rack, however, more often the interfaces are only accessible from behind the rack. Therefore, a human operator or technician must re-connect the monitor and keyboard cables to the computer interfaces in the back of the rack each time a different computer is accessed. This process is time-consuming and can sometimes result in the wrong computer being monitored. This defect is magnified when the mounted monitor is utilized in a time-critical computer system.

Other computer monitoring approaches are currently available. However, they too suffer from various defects. For example, in cases where the rack space is too valuable or unavailable, a cart-mounted keyboard and monitor is used. In this environment, the cart-mounted keyboard and monitor is stored until needed. When monitoring is necessary, a technician typically wheels the monitor cart to the rack of computers requiring monitoring. The technician then cables and connects the monitor and keyboard interfaces to the computer which requires monitoring. The cart-mounted monitoring solution has the one advantage of not occupying valuable rack space. However, this solution suffers the defects discussed above with reference to the dedicated rack-mounted monitor and keyboard solution. In addition, the cart-mounted monitor subjects employees to a higher risk of injury because the cart must be transported from rack to rack and because the keyboard and display interfaces must be cabled and re-cabled to the back of the rack. The requirement of re-cabling and re-connection is time-consuming, inefficient and sometimes costly if the technician makes a mistake.

Some systems have no readily available monitoring means on the same premises as the computers to be monitored. In this scenario, a technician must transport the monitor and keyboard from site to site whenever monitoring is required. This often occurs in emergency situations where a computer system has "crashed" or ceased functioning properly. Again, this solution suffers the defects of being time consuming, inconvenient, disruptive to customer operations and expensive if the monitor or keyboard is damaged in transit.

Thus, there is a need for a computer equipment monitor which is flexible, efficient, inexpensive and easy to use, yet which, when mounted, occupies very little storage space.

SUMMARY OF THE INVENTION

The present invention solves the problems in the prior art computer monitoring devices by providing a monitoring unit comprising a display, a keyboard and a discriminator, all electro-mechanically integrated into a low-profile slidably mountable storage drawer. In one preferred embodiment of the present invention, the monitoring unit is slidably mounted within a computer equipment rack which houses a plurality of computers requiring monitoring by the monitoring unit. The storage drawer of the monitoring unit is easily removable from its storage area for use, yet is streamlined when not in use to thereby occupy very little storage space. Thus, precious computer equipment space is preserved for devices which are more directly involved in performing the computer system application. In addition, the design of the present monitoring unit is compatible with standard computer racks, such as the EIA RS-310 standard 19-inch rack, making it universally mountable therein. At the same time, the present monitoring unit can be mounted in non-standard equipment racks or used in any environment where computer equipment space is a premium. Thus, the present invention represents a substantial improvement over computer monitoring devices of the prior art.

The present monitoring unit, while exhibiting many valuable monitoring features, as explained below in more detail, also can be inexpensively manufactured and maintained. The design of the present invention is compatible with standard keyboard and display interfaces, such as the well known 5-pin circular IBM PC/AT compatible keyboard interface as specified by the IBM, Corp. and the DB-25 display connectors. Thus, the monitoring unit can be manufactured using standard displays and keyboards. In addition, the present monitoring unit may be easily upgraded. More sophisticated displays and keyboards may be integrated into the present invention when desired. The keyboard and display are removably mounted in a storage drawer in separate housing partitions within the drawer. The keyboard and display may therefore be separately cleaned or replaced as needed.

As discussed above, the present monitoring unit is designed to interface with standard keyboards and displays. Thus, provided that the computers have standard keyboard and display interfaces, the present invention can monitor computers having differing operating systems and designs. Thus, the present monitoring unit offers great flexibility and has universal application.

In the preferred embodiment, the storage drawer of the present invention is substantially cubic in shape, having a height which is substantially less than its length and width. The storage drawer has two housing partitions shaped to accommodate the keyboard and display. The keyboard is removably mounted in a front housing partition located in a front portion of the drawer, while the display is rotatably mounted in a rear housing partition located behind the keyboard in a rear portion of the drawer. The drawer also has an enclosure which houses the discriminator. The discriminator controls communication between the monitoring unit and the computer selected for monitoring.

The storage drawer also has telescoping slides for mounting the monitoring unit into a large storage equipment rack. In addition, the storage drawer has elongate guide rails for guiding the storage drawer into the storage equipment rack. When the monitoring unit is in use, it is removed from the equipment rack by unlatching a panel attached to the front of the drawer, and withdrawing the unit from the rack using the telescoping slides to support and guide the monitoring unit. The front panel may be rotated downward to expose a wrist support which facilitates typing on the keyboard. The display is rotatably mounted by pivot points or hinges to the storage drawer so that the display can be rotated upward away from the storage drawer for viewing by a human operator. The display has a latch attached to the top of the display housing which secures the display in a compartment within the storage drawer when the monitoring unit is not in use.

Thus, to use the monitoring unit of the present invention, a human operator first deploys the display by releasing a latch and raising the display out of the display compartment in the storage drawer. The display is then tilted via the mounting hinges or pivot points by the operator to a comfortable viewing angle. The pivot points for the display are designed to produce friction sufficient to maintain the display in the raised position during use. Touching any keyboard key activates the display. Thus, the present monitoring unit is easy to use and adjustably accommodates any viewing height.

The preferred embodiment of the monitoring unit is designed to be stored within a computer equipment rack when not in use. After completing a monitoring procedure, a technician rotates the display toward its storage compartment located within the storage drawer and latches the display closed. Thus, when the display is latched closed within its compartment, the total height of the monitoring unit is much less than its length or width. Thus, the monitoring unit is designed to have a streamlined, substantially flat shape when closed and not in use. The streamlined design ensures that the monitoring unit occupies very little vertical space when it is stowed within the equipment rack. This represents an important advantage over prior art computer monitoring devices because of the diminished rack space occupied by the present monitoring unit during storage.

The monitoring unit is designed to be stowed securely within the equipment rack. The storage drawer has a front panel which is accessible from the front portion of the drawer. After completing a monitoring procedure, a technician re-inserts the storage drawer into the equipment rack as described hereinabove. The front panel is used to securely latch the monitoring unit into the rack via latch securing members in the front panel. Thus, the present invention can be quickly and securely mounted in an extremely low profile vertical space within the equipment rack. This represents an important advantage over prior art monitoring devices because the latches and front panel ensure that the monitoring unit is safely secured during storage. The front panel also facilitates insertion and withdrawal of the monitoring unit. Thus, the present invention is safe and easy to use.

Another important advantage of the present invention enables a human operator to easily and flexibly select a computer for monitoring. In one preferred embodiment, the monitoring unit is provided with a discriminator which allows the monitoring unit to communicate with a selected one of several computers within an equipment rack. Thus, by using the discriminator of the present invention, the human operator need not access the back of the equipment rack to disconnect and re-connect the keyboard and display cables. This feature provides tremendous cost and time saving advantages over the prior art computer monitoring devices.

In one embodiment, the drawer has an input device such as a keypad or a rotary switch, located on the top surface of the front housing partition of the storage drawer. The discriminator accepts commands from a human operator via the input device and performs the necessary signalling to select the computer within the equipment rack that requires monitoring. After the computer is selected, the discriminator circuit controls the flow of information between the keyboard, display and computer. When the human operator desires to monitor another computer, the operator selects the other computer via the keypad or rotary switch. The discriminator again performs the necessary signalling to enable the selected computer for monitoring.

In another preferred embodiment of the present invention, the discriminator monitors keystrokes entered on the keyboard in order to determine which computer within the equipment rack requires monitoring. Similar to the operation of the keypad and rotary switch, in this preferred embodiment the human operator enters commands to the discriminator via the keyboard. The discriminator scans the keyboard for the proper keystroke sequence, and performs the necessary signalling to select and enable the computer that requires monitoring. After the computer is selected, the discriminator controls the flow of information between the keyboard, display and computer. When the human operator desires to monitor another computer, the operator selects the other computer via the keyboard. The discriminator again performs the necessary signalling to enable the selected computer for monitoring.

The discriminator and input device provide substantial advantages over the prior art computer monitoring devices. An entire bay of computers, up to ten in the preferred embodiment, may easily and quickly be monitored. The present invention eliminates the time-consuming, dangerous, and error-inducing re-cabling procedure required in the prior art computer monitoring devices. Furthermore, the present discriminator eliminates the need for dedicated monitors. Moreover, the present invention ensures that a monitor will always be available in emergency situations. The present monitoring unit eliminates the need for transporting bulky monitoring carts and equipment from site to site.

In summary, the present monitoring unit represents an efficient and easy to use apparatus for monitoring multiple computers mounted within a storage cabinet. The present invention also provides a flexible computer monitor which occupies very little storage space when stowed.

These features and advantages, as well as others comprised in the present invention, are illustrated in the accompanying drawings and described below in more detail.

BRIEF DESCRIPTION OF THE DRAWINGS

FIG. 3a shows a top plan view of the monitoring unit according to the present invention taken along line 3A-3A of FIG. 3;

FIG. 5 is a left side elevational partial cutaway view of the monitoring unit according to the present invention taken along line 5—5 of FIG. 1;

FIG. 6 is a rear elevational view of the monitoring unit according to the present invention taken along line 6—6 of FIG. 1;

FIG. 7 is a partial cross-sectional view of the monitoring unit according to the present invention taken along line 7—7 of FIG. 1 showing detailed features of the display latching mechanism;

DETAILED DESCRIPTION OF THE PREFERRED EMBODIMENTS

Figure 1:
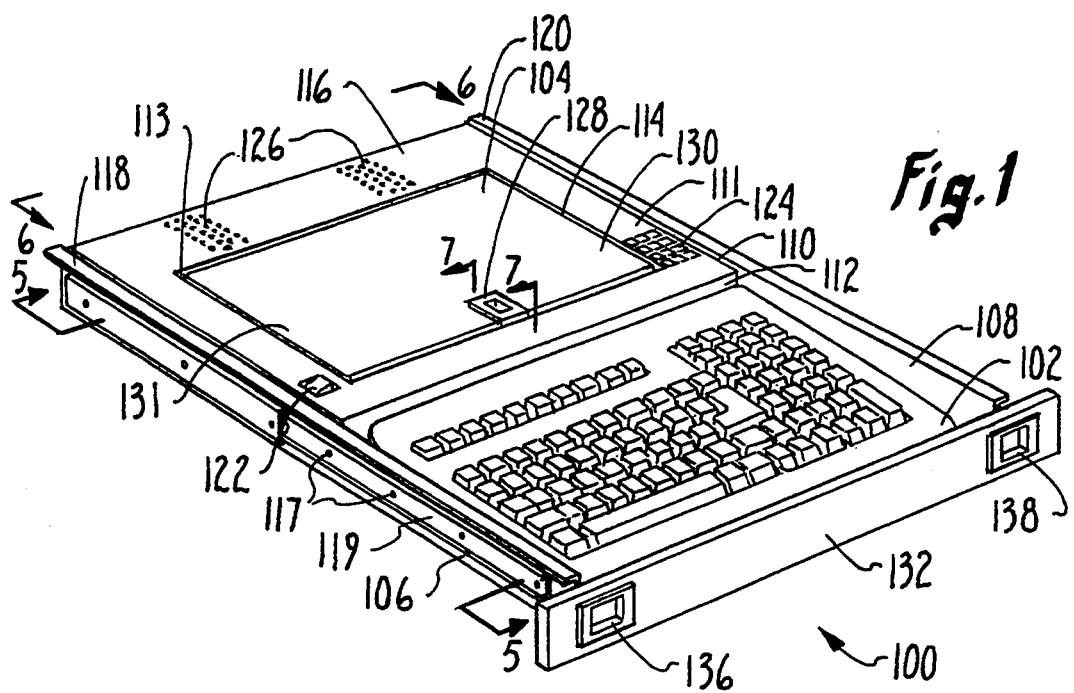
FIG. 1 illustrates a left front perspective view of one preferred embodiment of the monitoring unit according to the present invention showing the display and front panel in a fully collapsed and retracted storage position.

Reference is now made to the drawings wherein like numerals refer to like parts throughout. FIG. 1 shows one presently preferred embodiment of a computer monitoring unit according to the present invention generally indicated at 100. The monitoring unit 100 is shown in a closed configuration ready for storage. The monitoring unit 100 comprises a standard keyboard 102, a display 104 and a storage drawer 106. The display 104 is housed within a display housing 130. The display housing 130 is rotatably connected to the storage drawer 106 by pivot points 146, 148 (shown in FIG. 2) attached to opposite sides of the display housing 130. The pivot points 146, 148 are made of plastic material which provide friction between the pivot points 146, 148 and the storage drawer 106 sufficient to maintain the display housing 130 in the position to which it is rotated by a human operator. The display housing 130 is shown in FIG. 1 in a collapsed configuration.

The display housing 130 and the storage drawer 106 are preferably manufactured from ridged sheet metal, such as commercial cold rolled steel, SAE type 1010.

The storage drawer 106 is preferably substantially cubic in shape and functions to support and protect the display 104 and the keyboard 102. In the preferred embodiment of the present invention, the storage drawer 106 is no greater than 19 inches in width, no greater than 22 inches in length, and no greater than 1.75 inches in height. In one preferred embodiment, the storage drawer 106 is 17.37 inches in width, 20.91 inches in length, and 1.73 inches in height. The storage drawer 106 also functions to facilitate storage of the monitoring unit 100 within an electronic equipment rack (shown in FIGS. 3 and 4). In the preferred embodiment, the storage drawer 106, can be logically separated into a front housing partition 108 and a rear housing partition 110.

The separation point between the housing partitions 108, 110 is formed by a separation wall 112 that bridges the two partitions 108, 110.

The front housing partition 108 is shaped to accommodate a keyboard 102. The keyboard 102 is removably mounted by mounting screws 166 (shown in phantom in FIG. 5) onto a top surface 152 (shown in FIG. 2) of the front housing partition 108. The keyboard mounting screws 166 and the mounting of the keyboard 102 into the front housing partition 108 are described in more detail hereinbelow with reference to FIG. 5.

The keyboard 102 may be any standard personal computer keyboard. For example, in one embodiment, the keyboard 102 has full PC/AT compatibility with full-size keys and numeric key pad. In the preferred embodiment, the keyboard 102 is a PC/AT compatible keyboard available from American Sunrex Technology Corporation, Walnut, Calif., manufactured as Model No. Sunrex SR-8151B. Another such PC/AT keyboard is distributed by NMB Technologies, Inc., Chatsworth, Calif., manufactured as Model No. RT-6251T. In the preferred embodiment, the keyboard 102 has a travel tactile membrane which is dust and water resistant and extended-wear molded key caps for the standard set of 101 keys. The keyboard 102 has a cable 168 (shown in phantom in FIG. 5) which extends from the rear of the keyboard and is threaded through a hole (shown in phantom in FIG. 5) in the separation wall 112. The front housing partition 108 is designed to seat the keyboard 102 within the storage drawer 106 so that the maximum vertical height of the keyboard 102 does not extend beyond the minimum vertical height of the storage drawer 106.

The rear housing partition 110 has a display compartment 114 shaped to accommodate the display housing 130. The rear housing partition 110 has a top surface 111 which is formed of sheet metal attached to the top of the storage drawer 106 and which is in a horizontal plane substantially parallel to the length of the storage drawer. The display compartment 114 is formed by four vertical sidewalls cut into the top surface 111 of the rear housing partition 110 and a bottom surface 115 of the display compartment 114. Accordingly, the display compartment 114 is preferably rectangular, and functions to support and protect the display 104 when the display housing 130 is fully collapsed within the display compartment 114 for storage as is shown in FIG. 1.

The display compartment 114 is designed so that a back surface 131 of the display housing 130 is aligned with the top surface 111 of the rear housing partition 110 when the display housing 130 is in the fully collapsed position as shown in FIG. 1. Therefore, when the display housing 130 is fully collapsed, the back surface 131 of the display housing 130 and the top surface 111 of the rear housing partition 110 form a streamlined continuous horizontal surface. This feature facilitates storage of the monitoring unit 100 when it is not in use.

The display housing 130 serves to support and protect the display 104 during storage and use. The display 104 may be implemented as an LCD (liquid crystal display) or any other suitable technology that provides the attributes of compactness, lightweight and low power consumption. One presently preferred embodiment of the display 104 is a active matrix liquid crystal display (LCD) video graphics array (VGA) monochrome equivalent display having a pixel resolution of 640×480, model number LM64P80, available from Sharp Corporation of Japan. This particular display has outline dimensions of 279.6 mm×226 mm×11.5 mm (width×height×maximum depth), an effective viewing area of 198.37 mm×148.77 mm, and a pixel size of 0.27 mm×0.27 mm. The black and white display 104 has a black dot color on a back-lit white background and weighs approximately 650 grams. Another preferred embodiment of the display 104 is a passive matrix LCD VGA color display, having a 640×480 pixel resolution, model number LM64148E, available from Sharp Corporation of Japan. Of course, color displays, such as true-color VGA displays having passive or active display matrices, may also be used in the monitoring unit 100 at greater expense.

Referring again to FIG. 1, the rear housing partition 110 also contains a discriminator enclosure 116 adjacent the display compartment 114. The discriminator enclosure 116 houses the discriminator circuit 200 (not shown in FIG. 1) which is discussed in more detail hereinbelow. The top surface of the discriminator enclosure 116 has air vent holes 126 that allow heated air to escape the discriminator enclosure 116, thus maintaining the discriminator circuit 200 (not shown in FIG. 1) cool during operation. The air vent holes 126 are also drilled into the back of the discriminator enclosure 116 as shown in FIG. 6 and described hereinbelow.

The storage drawer 106 has two elongate guide rails 118, 120 that run the length of each side of the storage drawer 106. The guide rails 118, 120 are shaped to fit within storage sliding mechanisms (not shown) mounted within an electronic equipment storage rack (shown in FIGS. 3 and 4). The elongate guide rails 118, 120 facilitate mounting the monitoring unit 100 into telescoping storage slides 119 (shown in FIGS. 1, 2, and 4), which guide and retain the monitoring unit 100 within the equipment rack as it is extended for operation and collapsed for storage into the equipment rack.

As shown in FIG. 1, the storage drawer 106 has two telescoping storage slides 119 (also shown in FIGS. 2 and 4) mounted by mounting screws 117 to opposite sides of the storage drawer 106, just below the elongate guide rails 118, 120. As is well known in the art, the elongate storage slides 119 are typically comprised of ball bearing or drawer wheel members which are inserted within ball bearing cabinet members mounted by mounting screws to the inner side walls of the equipment rack. The elongate storage slides 119 and the cabinet members (not shown) are commonly available from chassis slide vendors. For example, in one preferred embodiment, the elongate storage slides 119 are available from Accuride, a Division of Standard Precision, Inc., manufactured as Part No. 203 LR. In another preferred embodiment, the elongate storage slides are available from General Devices Company, Inc., Indianapolis, Ind., manufactured as Model No. C-300-S. In another embodiment, the elongate storage slides 119 are available from Jonathan Manufacturing Corp., Fullerton, Calif., manufactured as Part. No. 375QD. The elongate storage slides 119 typically have locking members (not shown) which prevent the monitoring unit 100 from being pulled so far out of the equipment rack as to cause the monitoring unit 100 to fall.

A power switch 122 is mounted on the top surface 111 of the rear housing partition 110. The power switch 122 switches power to all of the electrical components of the monitoring unit 100. In one preferred embodiment, the power to the electrical components of the monitoring unit is provided via an AC to DC adapter (not shown) plugged into a power bus mounted to the back of the equipment rack. In an alternative embodiment, the power is provided over a cable 174 (described in more detail hereinbelow with reference to FIGS. 6 and 8–10) connected to the first computer in the equipment rack. In both embodiments, the power switch 122 disconnects or reconnects power to the electrical components of the monitoring unit 100 when the power switch 122 is depressed by the human operator.

The top surface of the rear housing partition 110 also contains a selector input device 124 positioned adjacent the display compartment 114. In one preferred embodiment, the selector input device 124 is implemented with a keypad or rotary switch. In another preferred embodiment, the selector input device 124 is not needed because the human operator uses the keyboard 102 to select the computer requiring monitoring. As is described in more detail hereinbelow with reference to the discriminator circuit 200, the selector input device 124 allows a human operator to communicate with the discriminator circuit 200. The discriminator circuit 200 controls communication with the computer selected for monitoring by the monitoring unit 100. The function and operation of the discriminator circuit 200 and the selector input device 124 is described in more detail hereinbelow.

Referring again to FIG. 1, the display housing 130 has a display latching mechanism 128 which is used to latch the display housing 130 securely within the display compartment 114 when the display housing 130 is fully collapsed and the monitoring unit 100 is ready for storage. The display housing 130 is placed in the collapsed position (shown in FIG. 1 and in phantom in FIG. 5) by rotating the display housing 130 clockwise about the pivot points 146, 148 until the display latching mechanism 128 engages an engagement slot 144 (shown in FIG. 7) punched into the rear of the separation wall 112. The display latching mechanism 128 is described in more detail hereinbelow with reference to FIG.

Figure 2:
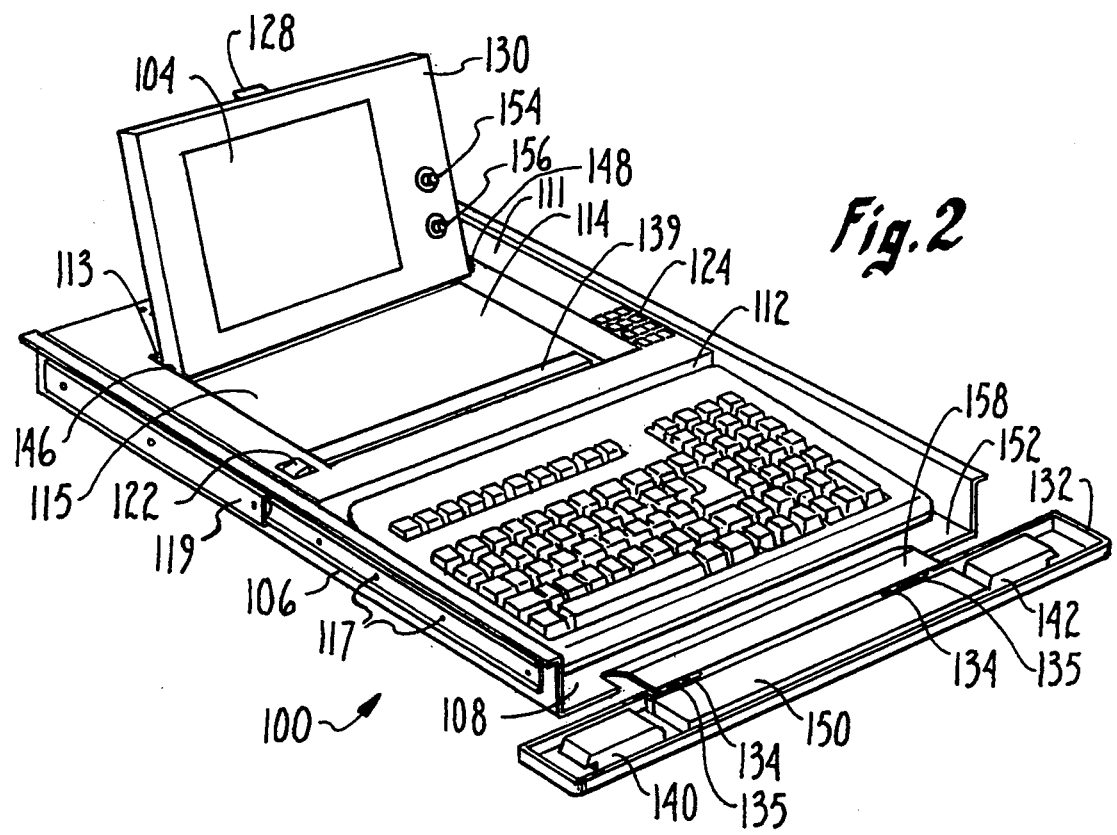
FIG. 2 shows a left front perspective view of the monitoring unit of FIG. 1 showing the display and front panel fully deployed and ready for use.
Figure 3:
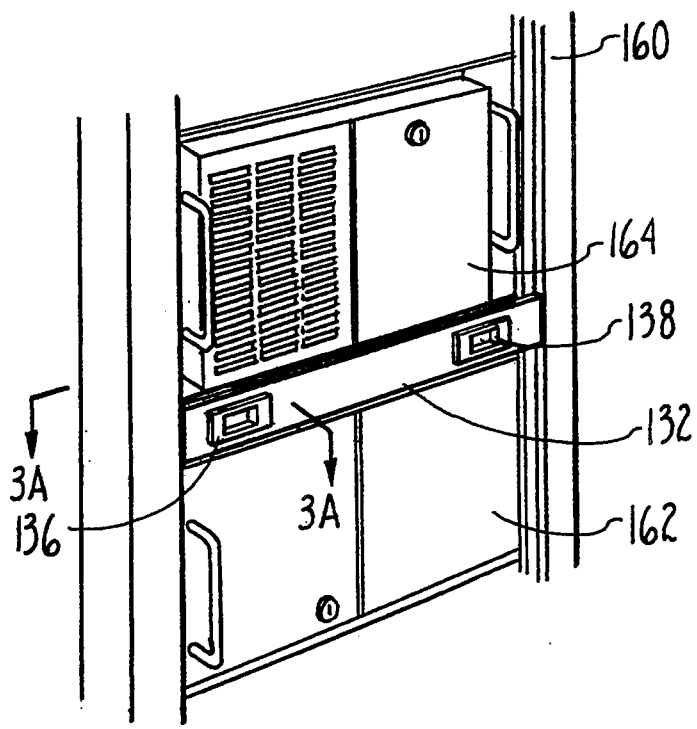
FIG. 3 is a left front perspective view of the monitoring unit of FIG. 1 showing the unit fully inserted within an electronic equipment rack.
Figure 4:
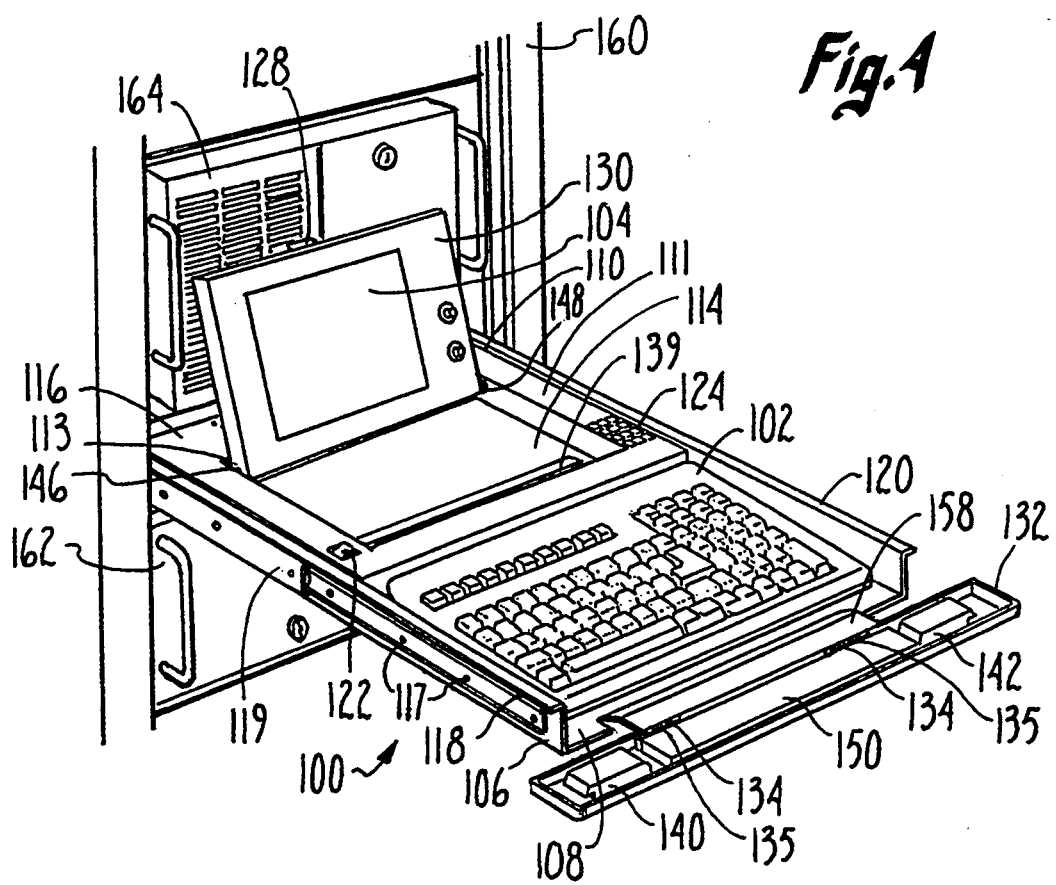
FIG. 4 shows a left front perspective view of the monitoring unit of FIG. 3 showing the unit fully deployed and withdrawn from the equipment rack and ready for use.

Referring again to FIG. 1, the monitoring unit 100 has a front panel 132 rotatably connected to the storage drawer 106 by panel hinges 134 (shown in FIG. 2). The front panel 132 is shown in FIG. 1 in a fully erected configuration and in this configuration serves to protect the monitoring unit 100 when the storage drawer 106 is inserted and stowed within an electronic equipment rack (shown in FIGS. 3 and 4). In the erected configuration, as shown in FIGS. 1, 3 and 5, the front panel 132 is rotated counterclockwise about the panel hinges 134 until the front panel 132 is perpendicular to the elongate guide rails 118, 120. The panel hinges 134 (shown in FIG. 2) have tension springs 135 (shown in FIG. 2) which bias the panel 132 in the erected configuration when the panel is in the erected configuration and which bias the panel in the fully collapsed configuration when the front panel is in the fully collapsed configuration (as shown in FIGS. 2 and 4).

As shown in FIG. 1, there are two panel latches 136, 138 mounted on the face of the front panel 132 having corresponding latch securing members 140, 142 (shown in FIGS. 2 and 4) extending through to the back of the front panel 132. The latches 136, 138 facilitate storage of the front panel 132 when the monitoring unit 100 is stowed within the equipment rack. The operation and function of the front panel 132 and the panel latches 136, 138 are described in more detail hereinbelow with reference to FIGS. 2–4.

Referring now to FIG. 2, the monitoring unit 100 is shown in a fully opened configuration and ready for use. In an erected configuration, as shown in FIGS. 2 and 4, and shown in phantom in FIG. 5, the display housing 130 is rotated counterclockwise about the pivot points 146, 148 until, at an angle that is obtuse to the normal, the bottom of the display housing 130 rests against an rear sidewall 113 at the rear of the display compartment 114. Using the pivot points 146, 148 for support, the display housing 130 may be rotated to a viewing angle that is comfortable to a human operator.

The pivot points 146, 148 are made of plastic material which provides sufficient friction between the display housing 130 and the storage drawer 106 to maintain the display housing 130 in the rotated position it is rotated to by the operator. In the preferred embodiment, the pivot points 146, 148 comprise threaded support studs (not shown) inserted through holes (not shown) drilled into opposite exterior sidewalls of the display housing 130, the support studs surrounded by plastic washers shaped to snugly fit within the holes, compression washers and locking nuts (not shown) which ensure that proper friction is produced by the pivot points 146, 148 against the display housing 130. The locking nuts may be tightened and re-tightened from access points (not shown) below the storage drawer 106. Thus, the pivot points 146, 148 ensure that the display housing 130 will be maintained in the position it is rotated to during use by the human operator.

With the display housing 130 in the fully erected configuration as shown in FIG. 2, a display shock absorbing pad 139 is revealed. The shock absorbing pad 139 is attached to the bottom surface 115 of the display compartment 114. In the preferred embodiment, the shock absorbing pad 139 comprises neoprene sponge material which has a gray woven nylon fabric covering. The pad 139 is adhered to the bottom surface 115 using pressure sensitive adhesive transfer film which is an acrylic or rubber based material, available from 3M, Inc., St. Paul, Minn., as Part No. 468. The shock absorbing pad 139 absorbs the mechanical energy produced when the display housing 130 is rotated into the display compartment 114. Thus, the shock absorbing pad ensures that the display housing 130, and more importantly, the display 104, do not experience large forces when the monitoring unit 100 is placed in the closed configuration as shown in FIGS. 1 and 3.

As shown in FIG. 2, the display housing 130 houses the display 104. The display housing has two control knobs 154, 156 for controlling the contrast and the brightness of the display 104. The control knob 154 controls the contrast, while the control knob 156 controls the brightness of the display 104.

The front panel 132 is shown in FIG. 2 in a fully collapsed configuration exposing a wrist support 150. In the preferred embodiment, the wrist support 150 comprises the same material as the shock absorbing pad 139. The wrist support is adhered to the back surface of the front panel 132 using the same material as is used to adhere the shock absorbing pad 139 to the surface 115. In a collapsed configuration, as shown in FIGS. 2 and 4, the front panel 132 is rotated clockwise about the panel hinges 134 until the front panel 132 lies in a plane which is parallel to a top surface 152 of the front housing partition 108.

With the front panel in a collapsed configuration as shown in FIG. 2, the keyboard 102 is accessible to the human operator. The wrist support 150 supports the wrists of a human operator while the human operator is typing on the keyboard 102, thus providing comfort to the human operator while operating the monitoring unit 100. In the preferred embodiment, the wrist support 150 comprises the same material as the display shock absorbing pad 139. Therefore, in the preferred embodiment, the wrist support 150 comprises neoprene sponge material which has a gray woven nylon fabric covering. The wrist support 150 is adhered to the back of the front panel 132 using a pressure sensitive adhesive transfer film which is an acrylic or rubber based material, available from 3M, Inc., St. Paul, Minn., as Part No. 468.

As shown in FIG. 2, the front panel 132 is rotatably connected by the panel hinges 134 to a panel support member 158 extending from the top surface 152 of the front housing partition 108. In addition, the latch securing members 140, 142 are shown projecting through the back surface of the front panel 132. When the monitoring unit 100 is fully inserted within the equipment storage rack (as shown in FIG. 3), the latch securing members 140, 142 interconnect with mating connectors mounted within the equipment storage rack. FIG. 3a shows a mating connector 141 which interconnects with the latch securing member 140. The mating connectors 141 and 143 (not shown) are described in more detail hereinbelow with reference to FIGS. 3 and 3a. In the preferred embodiment of the present invention, the latch securing members 140, 142 are plastic fasteners available from Southco, Inc., Concordville, Pa., manufactured as Part No. A3-40-625-12. In the preferred embodiment, the latch securing members 140, 142 and the display latching mechanism 128 are all implemented with the plastic fasteners available from Southco, Inc., Concordville, Pa.

As described in more detail hereinbelow with reference to FIGS. 3 and 3a, the latch securing members 140, 142 have torsion springs (shown in FIG. 3a), mounted to the front panel 132. The torsion springs produce force on the latch securing members 140, 142 in a direction away from the center of the front panel 132 and away from the wrist pad 150. Therefore, when a human operator wants to withdraw the monitoring unit 100 from the electronic equipment rack, the operator must produce force on the latch securing members 140, 142 in an inward direction toward the center of the front panel 132, thus disengaging the latch securing members 140, 142 from the mating connectors (e.g. 141 shown in FIG. 3a) mounted to the electronic equipment rack. Alternatively, when the human operator slides the monitoring unit 100 into the electronic equipment rack, the latch securing members 140, 142 are forced by the torsion springs in an outward direction away from the center of the front panel 132 so as to engage the mating connectors mounted to the electronic equipment rack. In this manner, the monitoring unit 100 is stowed securely within the equipment rack. The operation and function of the latch securing members 140, 142, the mating connectors 141, 143 and the torsion springs are described in more detail hereinbelow with reference to FIG. 3a.

Referring now to FIG. 3, the monitoring unit 100 is shown fully inserted within an equipment rack 160. As shown in FIG. 3, when the monitoring unit 100 is fully inserted within the equipment rack 160, only the front panel 132 and the panel latches 136, 138 are exposed to the operator. The monitoring unit 100 is shown positioned between two pieces of computer equipment, for example, a power supply 162 and telecommunications equipment 164. As can be seen in FIG. 3, the monitoring unit 100 occupies very little vertical rack space within the equipment rack 160 in relation to the vertical rack space occupied by the other computer equipment in the rack. In the preferred embodiment, the monitoring unit 100 is designed to occupy a maximum of 1.75 inches of vertical rack space within the equipment rack 160. Therefore, the monitoring unit 100 occupies very little vertical rack space in relation to the other equipment within the rack 160.

FIG. 3a shows a top plan view of the monitoring unit according to the present invention taken along line 3A—3A of FIG. 3. FIG. 3a illustrates details of the interconnection between the latch securing member 140 and the mating connector 141 mounted inside a left-front vertical mounting column (not shown) of the equipment rack 160 shown in FIG. 3. In one preferred embodiment, the latch securing members 140, 142 are designed to interconnect with the mating connectors 141 (shown FIG. 3a), 143 (not shown) as described hereinbelow. For simplicity and clarity, only one mating connector, 141, is shown in FIG. 3a. One skilled in the art will recognize that the interconnection and operation of the mating connector 143 (not shown) and the latch securing member 142 function similarly to the mating connector 141 and the latch securing member 140.

As is well known in the art, EIA RS-310 standard 19-inch racks have vertical mounting columns located at the four corners of the rack which are used for securing mounting rails and face-plate mounting devices. One such 19-inch rack is available from General Devices Company, Inc., Indianapolis, Ind., manufactured as Series No. 6200. As shown in FIG. 3a, the mating connector 141 has an angled mounting bracket 400. The angled mounting bracket 400 allows the mating connector 141 to be mounted to the left-front vertical mounting column (145) positioned within the EIA RS310 standard 19-inch rack 160 (FIG. 3).

As shown in FIG. 3a, the mating connector 141 has a U-shaped mating clamp 147 having an open ended face. When the mating connector 141 is secured to the left-front vertical mounting column (145) of the equipment rack 160 (shown in FIG. 3), an open end of the U-shaped mating clamp 147 faces the middle of the equipment rack 160.

As shown in FIG. 3a, the latch securing member 140 is slidably mounted to the front panel 132. The latch 140 has a narrow engagement member 149 which protrudes from the left-most side of the latch 140 (shown as the bottom-most side of the latch 140 in FIG. 3a). The latch 140 also has a torsion spring 151 mounted to the front panel 132. The torsion spring 151 forces the latch 140 and biases the latch 140 in a direction away from the center of the panel 132 and toward the protruding engagement member 149. As shown in FIG. 3a, the open end of the U-shaped mating clamp 147 is shaped to fit the engagement member 149 which extends from the latch securing member 140.

Thus, when the front panel 132 is in a fully erected configuration, as shown in FIG. 3 and in top view in FIG. 3a, and the storage drawer 106 is inserted within the electronic equipment rack (as shown in FIG. 3), the torsion spring 151 forces the protruding engagement member 149 into the open end of the U-shaped clamp 147. Therefore, the latch securing members 140, 142 ensure that the front panel 132 and thus the monitoring unit 100 is safely and securely stowed during storage.

A human operator uses the latch securing members 140, 142 to stow the monitoring unit 100 as follows.

Assuming that the storage drawer 106 is originally in a withdrawn position, as shown in FIG. 2, the human operator rotates the front panel 132 in a counterclockwise direction until the front panel 132 (FIG. 2) is in the fully erected configuration as described hereinabove with reference to FIG. 1. The operator then slides the drawer 106 toward the rack 160 (FIG. 3) until the latch securing members 140, 142 (FIGS. 2 and 4) come into contact with the mating connectors 141 (FIG. 3a), 143 (not shown) mounted within the equipment rack 160 (FIG. 3) as described hereinabove.

Because the engagement members, (e.g. 149) are slightly angled, becoming increasingly narrow toward the end of the engagement members as shown in FIG. 3a, the mating connectors 141, 143 force the corresponding engagement members (e.g. 149) in a direction toward the center of the rack 160 and against the direction of the force produced by the torsion springs (e.g. 151). Eventually, the engagement member 149 is pushed sufficiently inwardly, toward the center of the panel 132, to allow the engagement member 149 to enter the open end of the U-shaped clamp 147 of the mating connector 141. At this point, the mating connectors 141, 143 are engaged with the latch securing members 140, 142, and the face plate 132 (FIG. 3) and the monitoring unit 100 are safely and securely stowed within the equipment rack 160 as shown in FIG. 3.

As discussed hereinabove with reference to FIG. 2, the panel latches 136, 138 are used by the human operator to withdraw the monitoring unit 100 from the equipment rack 160. Thus, in order to gain access to the monitoring unit 100, the human operator pushes the panel latches 136, 138 toward each other, in a direction toward the center of the front panel 132, with sufficient force to overcome the bias produced by the latch torsion springs (e.g. spring 151 shown in FIG. 3a). This pushing action disengages corresponding latch securing members 140, 142 (shown in FIGS. 2, 3a and 4) from the mating connectors 141 (shown in FIG. 3a), 143 (not shown) as discussed hereinabove with reference to FIG. 3a. Once the latch securing members 140, 142 are disengaged from the mating connectors 141, 143, the monitoring unit is withdrawn from the equipment rack 160 by pulling on the panel latches 136, 138 in an outwardly direction away from the equipment rack 160.

FIG. 4 shows the monitoring unit 100 fully withdrawn from the equipment rack 160 and ready for use. As shown in FIG. 4, the front panel 132 has been rotated clockwise about the panel hinges 134 into a collapsed configuration. As discussed hereinabove with reference to FIG. 2, the display housing 130 has been rotated counterclockwise about the pivot points 146, 148 to an erected configuration. Once the display housing 130 and its enclosed display 104 are rotated to a comfortable viewing angle, the monitoring unit 100 is ready for use. After turning on the power switch 122, the display 104 is illuminated, in a manner well-known in the art, by striking any key on the keyboard 102. In the preferred embodiment, the display is illuminated with the identification number of the computer selected by the human operator. In the preferred embodiment, the identification number is displayed in the upper right-hand corner of the display. Once the monitoring unit 100 is enabled in this manner, the human operator may then select the computer in the equipment rack 160 that requires monitoring. For this purpose, the human operator uses the selector input device 124 located on the top surface 111 of the rear housing partition 110 of the storage drawer 106.

As discussed hereinabove with reference to FIGS. 1 and 2, the selector input device 124, in a preferred embodiment, is either a keypad or rotary switch. The human operator inputs the selected computer to be monitored by the monitoring unit 100 via the selector input device 124. For example, assuming that the telecommunications equipment 164 is to be monitored by the monitoring unit 100, the human operator inputs the address of the telecommunications equipment 164 by selecting the address with the input selector device 124. That address is communicated to the discriminator circuit 200 (not shown) located within the discriminator enclosure 116 adjacent to and to the rear of the display compartment 114. The discriminator circuit 200 controls communication between the monitoring unit 100 and the telecommunications equipment 164. Once the selected computer is enabled, the identification number of the selected computer is displayed on the display 104 in order to confirm to the operator that the proper computer has been selected for monitoring. The function and operation of the discriminator circuit 200 is described in more detail hereinbelow with reference to FIGS. 8-11.

When the operator completes a monitoring procedure, the monitoring unit 100 is turned off by depressing the power switch 122. The display housing 130 is placed in a collapsed configuration by rotating the display housing 130 clockwise about the pivot points 146, 148 and inserting the display housing 130 within the display compartment 114. The display housing 130 is secured within the display housing 114 via the display latching mechanism 128. The front panel is placed in a closed and erected configuration by rotating the front panel 132 counterclockwise about the panel hinges 134. After this procedure, the monitoring unit 100 is in the closed configuration shown in FIG. 1. The human operator then re-inserts the monitoring unit 100 into the equipment rack 160 using elongate guide rails 118, 120 to guide the telescoping storage slides 119 into commercially available chassis slides (not shown) mounted within the equipment rack 160. When the storage drawer 106 is inserted completely within the equipment rack 160, as shown in FIG. 3, the monitoring unit 100 is secured in place by the latch securing members 140, 142 as described hereinabove with reference to FIG. 2. Thus, the monitoring unit 100 is easily inserted and withdrawn from the equipment rack 160.

The side of the monitoring unit 100 is illustrated in FIG. 5. In FIG. 5, the front and rear housing partitions are revealed by showing the monitoring unit 100 in partial cutaway. With the monitoring unit 100 in a closed configuration, the display housing 130 is rotated clockwise about the display pivot points 146, 148 until the display latching mechanism 128 engages the engagement slot 144 which is punched into the separation wall 112. The display 104 is interconnected with the discriminator circuit 200 (not shown) via a display ribbon cable 129. The display ribbon cable 129 carries all of the electrical signals necessary to drive the display 104. As shown in FIG. 5, the display ribbon cable 129 is threaded, in a conventional manner, through a hole (not shown) in the bottom display housing 130 and through the bottom of the rear sidewall 113. The ribbon cable 129 is terminated at the discriminator circuit 200 within the discriminator enclosure 116. The display ribbon cable 129 is long enough to ensure that the display housing 130 may be freely rotated about the pivot points 146, 148 without tangling the cable 129.

The front panel 132 is shown in a closed and erected configuration in FIG. 5. In this configuration, the front panel 132 is rotated counterclockwise about hinges 134 until the front panel 132 is perpendicular to the length of the storage drawer 106.

The keyboard 102 is revealed in the partial cutaway of the monitoring unit 100 shown in FIG. 5. The keyboard 102 is removably mounted by the mounting screws 166 (shown in phantom) to the top surface 152 of the front housing partition 108 of the storage drawer 106. In the preferred embodiment, there are at least four mounting screws 166 which are inserted through holes in the bottom of the storage drawer 106 into counter bores (not shown) located within the base of the keyboard 102.

A keyboard interface cable 168 protrudes from the back of the keyboard 102. As shown in FIG. 5, the keyboard interface cable 168 is threaded through a horizontal hole 170 (shown in phantom) that is punched through the separation wall 112 which separates the front housing partition 108 from the rear housing partition 110. The keyboard interface cable 168 carries the electrical signals generated by the keyboard 102 and transmits these signals to the discriminator circuit 200. In the preferred embodiment, the keyboard interface cable 168 is cabled around the sidewalls of the display compartment 114 and under the top surface 111 of the rear housing partition. The keyboard interface cable 168 is electrically connected to the discriminator circuit 200 which is housed within the discriminator enclosure 116. The keyboard interface cable signals and the operation of the discriminator circuit are described in more detail hereinbelow with reference to FIGS. 8–11.

The discriminator circuit 200 is electrically connected to DB-25 connectors 172 (shown in FIGS. 5 and 6) mounted on the back panel of the storage drawer 106. As described in more detail hereinbelow with reference to the discriminator circuit 200, the DB-25 connectors 172 provide the necessary display and keyboard signals for transmission to the computers requiring monitoring. Each computer in the electronic equipment rack 160 (shown in FIGS. 3 and 4) has a discriminator cable 174 to transmit the keyboard and display signals between the computer and the monitoring unit 100. The discriminator cables 174 are interconnected with the monitoring unit 100 via the DB-25 connectors 172 mounted on the back panel of the storage drawer 106. In the preferred embodiment of the present monitoring unit 100, the storage drawer 106 has at least 10 DB-25 172 connectors mounted to the back panel as shown in FIG. 6.

Referring now to FIG. 6, a rear view of the monitoring unit 100 shows the back panel of the storage drawer 106 with a plurality of the DB-25 connectors 172 mounted therein. FIG. 6 shows the monitoring unit 100 having one discriminator cable 174 interconnected with one DB-25 connector 172 at the far right of the storage drawer 106. The discriminator cable 174 is threaded through the back of the electronic equipment rack (shown in FIGS. 3 and 4) and interconnected with a computer requiring monitoring (not shown).

As discussed hereinabove, in the preferred embodiment, the monitoring unit is equipped with up to 10 DB-25 connectors 172, and thus, up to 10 discriminator cables 174 may be connected to the monitoring unit 100. Thus, in the preferred embodiment, the monitoring unit 100 is capable of monitoring up to 10 different computers per electronic equipment rack. However, the present invention is not limited to monitoring up to 10 computers. Rather, more computers may be monitored by the present invention, by simply adding DB-25 connectors 172 to the monitoring unit 100. The amount of computers which may be monitored by the present invention is limited only by the practical number of computers which may be mounted within the equipment rack.

As described in more detail hereinbelow with reference to FIG. 12, advantageously, the monitoring unit 100 is used in an alternative embodiment of the present invention in a computer monitoring system to monitor ten computers which are stored within the electronic equipment rack. In this system environment, the monitoring unit 100 is equipped with 10 DB-25 connectors 172, and thus, 10 discriminator cables 174 are connected between the 10 computers in the equipment rack and the monitoring unit 100. Thus, in this alternative embodiment, the monitoring unit 100 is capable of monitoring 10 different computers within the electronic equipment rack. By taking advantage of the low vertical height of the monitoring unit 100, the computer system can accommodate the 10 computers within the rack. Typically, an equipment rack will house no more than 10 computers requiring monitoring.

FIG. 6 also shows air vent holes 126 which are punched through the back panel of the storage drawer 106. As discussed hereinabove with reference to FIG. 1, the air vent holes 126 facilitate cooling of the discriminator circuit 200 (not shown) during operation.

Referring now to FIG. 7, the display latch 128 is now described in more detail. As described hereinabove with reference to FIG. 2, in the preferred embodiment, the display latch 128 is implemented with the same plastic fastener as the latch securing members 140, 142 plastic fasteners available from Southco.

FIG. 7 shows a partial cross-sectional view of the display latch 128. In FIG. 7 the display latch 128 is shown fully engaged within the engagement slot 144. In this position, the display housing 130 is in a fully collapsed configuration (shown in FIG. 1). The display latch 128 ensures that the display housing 130 remains securely stowed within the display compartment 114 (shown in FIGS. 1 and 4).

As shown in FIG. 7, the display latch 128 is slidably mounted to the front top surface of the display housing 130. The display latch 128 has a narrow engagement member 176 which protrudes from the left-most side of the latch 128. The display latch 128 also has torsion springs 178 mounted to the display housing 130. The torsion springs 178 force the display latch 128 in a direction away from the display housing 130 and toward the protruding engagement member 176. Thus, when the display housing 130 is fully collapsed within the display compartment 114, as shown in FIG. 1, the torsion springs 178 force the protruding engagement member 176 into the engagement slot 144. Thus, the display latch 128 ensures that the display housing 130 is safely and securely stowed during storage.

As shown in FIG. 7, the display latch 128 also has a display latch handle 180. The display latch handle 180 allows a human operator to disengage the display latch 128 from the engagement slot 144 and remove the display housing 130 from the display compartment 114. In order to disengage the display latch 128, the human operator simply inserts a finger or other narrow object into the display latch handle 180, and produces force on the display latch 128 toward the display housing 130 sufficient to overcome the force produced by the latch torsion springs 178. Eventually, the protruding engagement member 176 is sufficiently retracted from the engagement slot 144 so that the human operator may rotate the display housing 130 in an upward direction away from the display compartment 114. The display housing 130 may then be rotated to adjust the display 104 (shown in FIGS. 2 and 4) to a comfortable viewing angle. After the monitoring procedure is completed, the display housing 130 is rotated into the display compartment 114 until the display latch 128 and protruding engagement member 176 engages the engagement slot 144. The display housing 130 and display 104 may then be securely stowed within the equipment rack.

Figure 8:
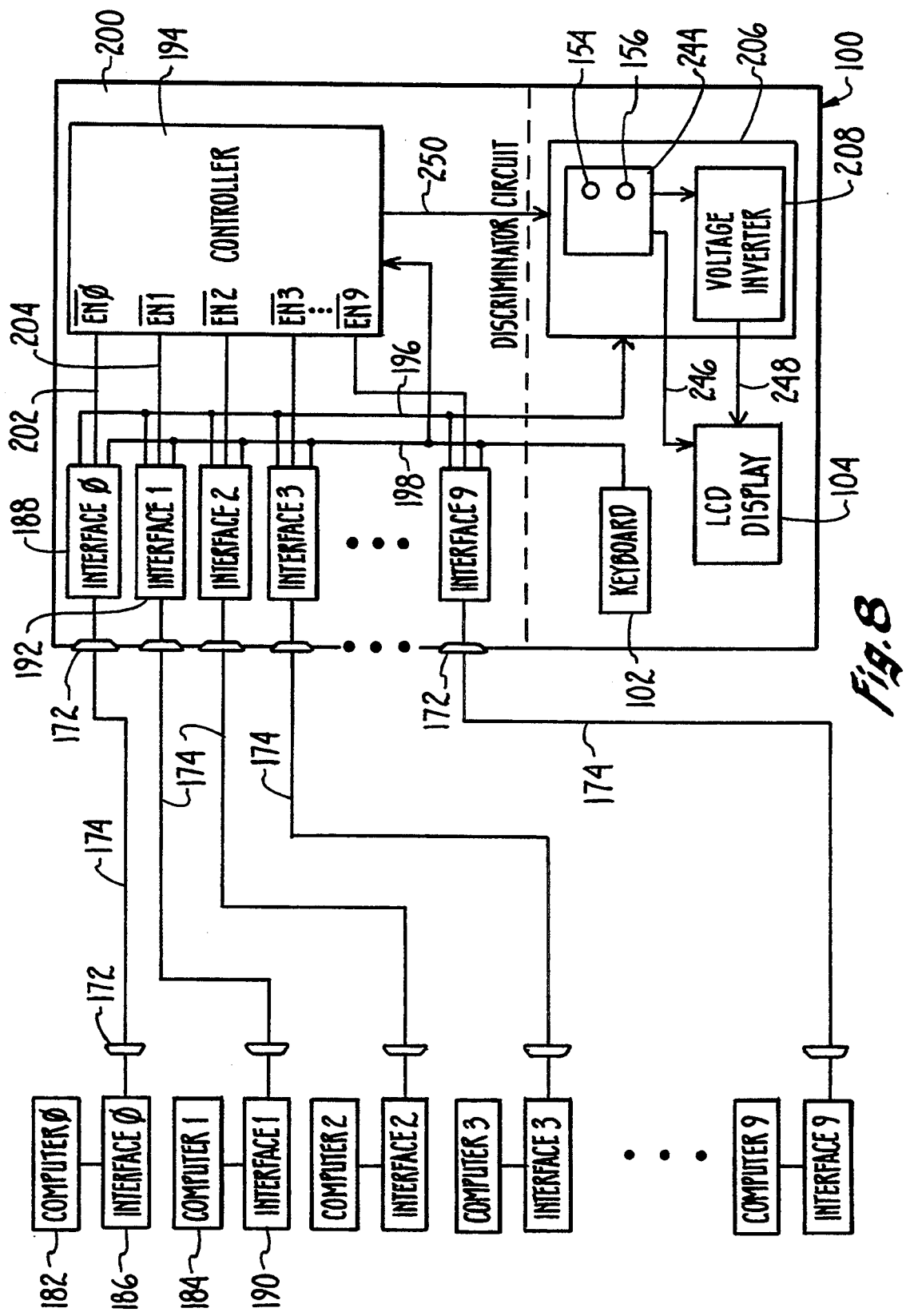
FIG. 8 shows an electrical block diagram schematic of the monitoring unit 100 of the present invention as used in a multiple processor computer system.

Referring now to FIG. 8, an electrical block diagram schematic of the monitoring unit 100 of the present invention is shown as used in a multiple processor computer system. As shown in FIG. 8, one preferred embodiment allows a user to select one of ten computers to be monitored by the monitoring unit 100. As described hereinabove with reference to FIGS. 5 and 6, one preferred embodiment of the monitoring unit 100 has up to ten DB-25 connectors 172 which interface with up to ten separate discriminator cables 174, each cable capable of transmitting twenty-five electrical signals to up to ten different computers. Each cable 174 is threaded through the backplane of the electronic equipment rack (shown in FIGS. 3 and 4) and connected with each computer serviced by the monitoring unit 100. For example, as shown in FIG. 8, the discriminator circuit 200 is electrically connected to a computer-0 182 via the discriminator cable 174. A computer-1 184 is similarly connected to the discriminator circuit 200 via another discriminator cable 174.

As shown in FIG. 8, the computer (e.g. 182) and the discriminator circuit 200 communicate with each other via dedicated interface circuits designed to buffer and drive electrical signals between the two devices using cable 174 as a conduit. For example, the computer-0 182 has a computer interface-0 186 which communicates with the discriminator circuit 200 via a discriminator interface-0 188 using cable 174 as the conduit between the interfaces 186 and 188. Similarly, the computer-1 184 has a computer interface-1 190 which communicates with the discriminator circuit 200 via a discriminator interface-1 192. Thus, each computer (e.g. 182, 184) which is monitored by the monitoring unit 100 has a dedicated computer interface (e.g. 186, 190) which drives and buffers electrical signals for transmission over a cable 174 to a dedicated discriminator interface (e.g. 188, 192) in the discriminator circuit 200. The dedicated computer interface is described in more detail hereinbelow with reference to FIG. 9, and the discriminator interface is described in more detail hereinbelow with reference to FIG. 10.

The discriminator circuit 200 has a discriminator controller 194 or micro-controller. In the preferred embodiment, the discriminator controller 194 is an 8-bit micro-controller commonly available from Intel, Inc., manufactured as Part No. 8048AH. The discriminator controller 194 performs the control operations for the discriminator circuit 200. The operation and function of the discriminator controller 194 is described in more detail hereinbelow with reference to FIGS. 10 and 11.

One of the functions of the discriminator controller 194 is to control the enable signals which gate input and output signals onto data busses internal to the discriminator circuit 200. Therefore, the discriminator controller 194 produces enable signals which are connected to the enable input lines of each discriminator interface. As shown in FIG. 8, the discriminator interfaces (e.g. 188, 192) have their outputs bussed together (electrically connected together) onto an output bus 196. The output bus 196 signals are used to control and drive the display 104. The input/output keyboard signals which are connected to the keyboard 102 are also bussed together onto a keyboard bus 198. As described in more detail hereinbelow with reference to FIG. 10, the interfaces each have enable signals which gate the input and output signals onto the busses 196, 198.

For example, when the input enable signal for interface-0 188 is a logically true value, the interface-0 188 will assert its output signals onto the output bus 196. The remaining interfaces (1-9) will not be enabled by the discriminator controller 194, i.e. the discriminator controller 194 will not assert any other enable signal logically true, and therefore the remaining interfaces will not simultaneously assert their respective output signals onto the output bus 196. In contrast, when the input enable signal for interface-0 188 is a logically false value, the interface-0 188 will not assert its output signals onto output bus 196. Rather, one of the other nine interfaces will be enabled by the discriminator controller 194 and will assert its output signals onto the output bus 196.

The keyboard signals are similarly gated onto the keyboard bus 198. For example, when the input enable signal for interface-0 188 is a logically true value, the interface-0 188 will allow its keyboard signals to be transferred across the interface-0 188 to the computer-0 182 in the equipment rack. The remaining interfaces (1-9) will not be enabled, and therefore not simultaneously transfer their respective keyboard input/output signals to their respective computers (1-9). In contrast, when the input enable signal for interface-0 188 is a logically false value, the interface-0 188 will not transfer the keyboard data bus 198 signals to computer-0 182. Rather, one of the other nine interfaces will be enabled by the discriminator controller 194 and will transfer the keyboard data bus 198 signals to its respective computer (1-9).

As is described in more detail hereinbelow with reference to FIGS. 10 and 11, the discriminator controller 194 controls the operation of the discriminator circuit 200. Among other important functions, the discriminator controller 194 controls the enabling of the computer and discriminator interfaces. Each interface is separately enabled via control lines driven by the discriminator controller 194. When the control lines are asserted, the interfaces are enabled as described hereinabove.

For example, the discriminator interface-0 188 is enabled by a control line 202. The control line 202 also enables the computer-0 182 and its computer interface-0 186. Similarly, the discriminator interface-1 192 is enabled by a control line 204. The control line 204 also enables the computer-1 184 and its computer interface-1 190. The enable control lines (e.g. 202, 204) are asserted by the discriminator controller 194 in a mutually exclusive manner, i.e. only one control line is asserted at a time. The operation of the discriminator controller 194 is described in more detail hereinbelow with reference to FIG. 11.

As shown in FIG. 8, the monitoring unit 100 of the present invention has the display 104, the keyboard 102, and the discriminator circuit 200 as described hereinabove. The display 104 has a display control 206 which is comprised of a brightness/contrast board 244 (described in more detail with reference to FIG. 10) and a voltage inverter 208. The display control 206 is receivably connected to the output data bus 196 which carries the electrical signals necessary to control the display 104.

In the preferred embodiment of the present invention, the DC power required to operate the electrical components of the monitoring unit 100 shown in FIG. 8 is produced by an AC to DC adapter (not shown) connected to an AC power bus mounted to the back of the electronic equipment rack. In an alternative embodiment, the DC power required to operate the electrical components of the monitoring unit 100 shown in FIG. 8 is transmitted along one discriminator cable (e.g. the discriminator cable 174 that connects the computer-0 interface 186 with the discriminator interface-0 188).

Referring again to FIG. 8, whenever a computer is enabled by the discriminator controller 194, the output bus 196 transmits display control signals from the enabled computer to drive the display 104 via the display control 206. The output of the display control 206 is connected to the LCD display 104 using the display ribbon cable 129 via display signal bus lines 246, 248 (described in more detail hereinbelow with reference to FIG. 10). The voltage inverter 208 produces the AC voltage levels necessary to drive the backlight and brightness of the display panel 104. In the present invention, the voltage inverter 208 converts between 3 to 5 VDC (provided by the AC-DC adapter in the preferred embodiment or transmitted over the discriminator cable 174 in an alternative embodiment) to approximately 300 VAC which is sufficient to power the display backlight. The function and operation of the display control 206 is described in more detail hereinbelow with reference to FIG. 10.

The present monitoring unit 100 also has the keyboard 102 as described hereinabove with reference to FIG. 1. The keyboard data and timing signals are transferred to the computers in the equipment rack (e.g. computer-0 182 and computer-1 184) via the discriminator interfaces (e.g. interface-0 188 and interface-1 192). The keyboard signals are bussed together within the discriminator circuit 200 onto the keyboard bus 198. Depending upon which interface is enabled by the discriminator controller 194, the keyboard data will be transmitted between the keyboard and the enabled computer within the equipment rack.

The keyboard bus 198 is a bi-directional two-line bus consisting of a signal line for keyboard data and a signal line for keyboard clock. The keyboard bus 198 is bidirectional to allow the enabled computer to perform a simple well-known handshake function with the keyboard. This handshake function, as is well known in the art, consists of the enabled computer communicating with the keyboard every time a keystroke is entered on the keyboard 102. The enabled computer informs the keyboard 102 that it has received a keystroke and is ready to receive another keystroke input. The keyboard bus 198 is also input to the discriminator controller 194. The discriminator controller 194 monitors the keyboard bus 198 in order to control the discriminator interface enable signals. The operation of the discriminator controller 194 and its interaction with the keyboard 102 and the keyboard bus 198 are described in more detail hereinbelow with reference to FIGS. 10 and 11.

Figure 9:
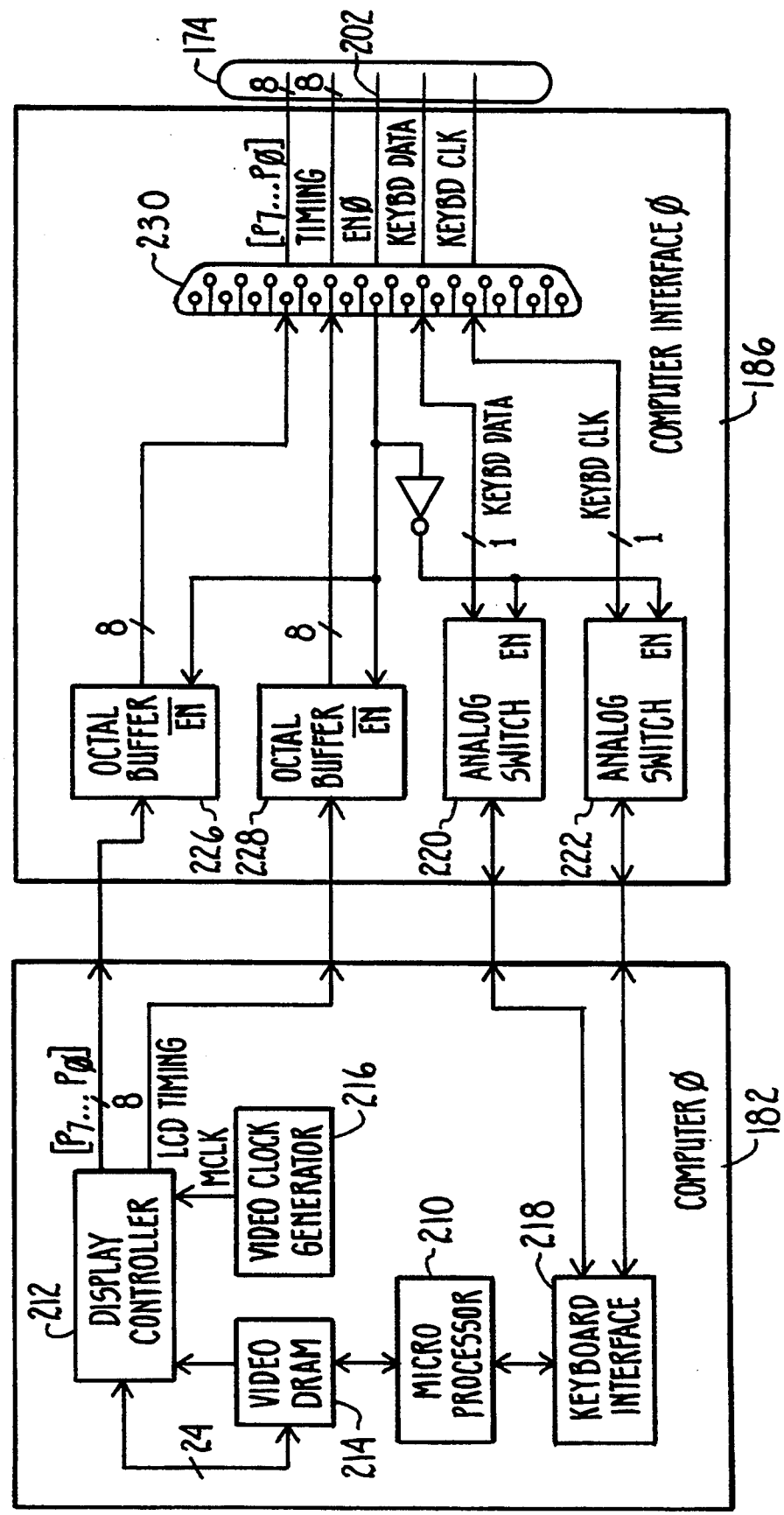
FIG. 9 illustrates an electrical schematic diagram of a computer and related computer interface used in the multiple processor computer system shown in FIG. 8.
Figure 10:
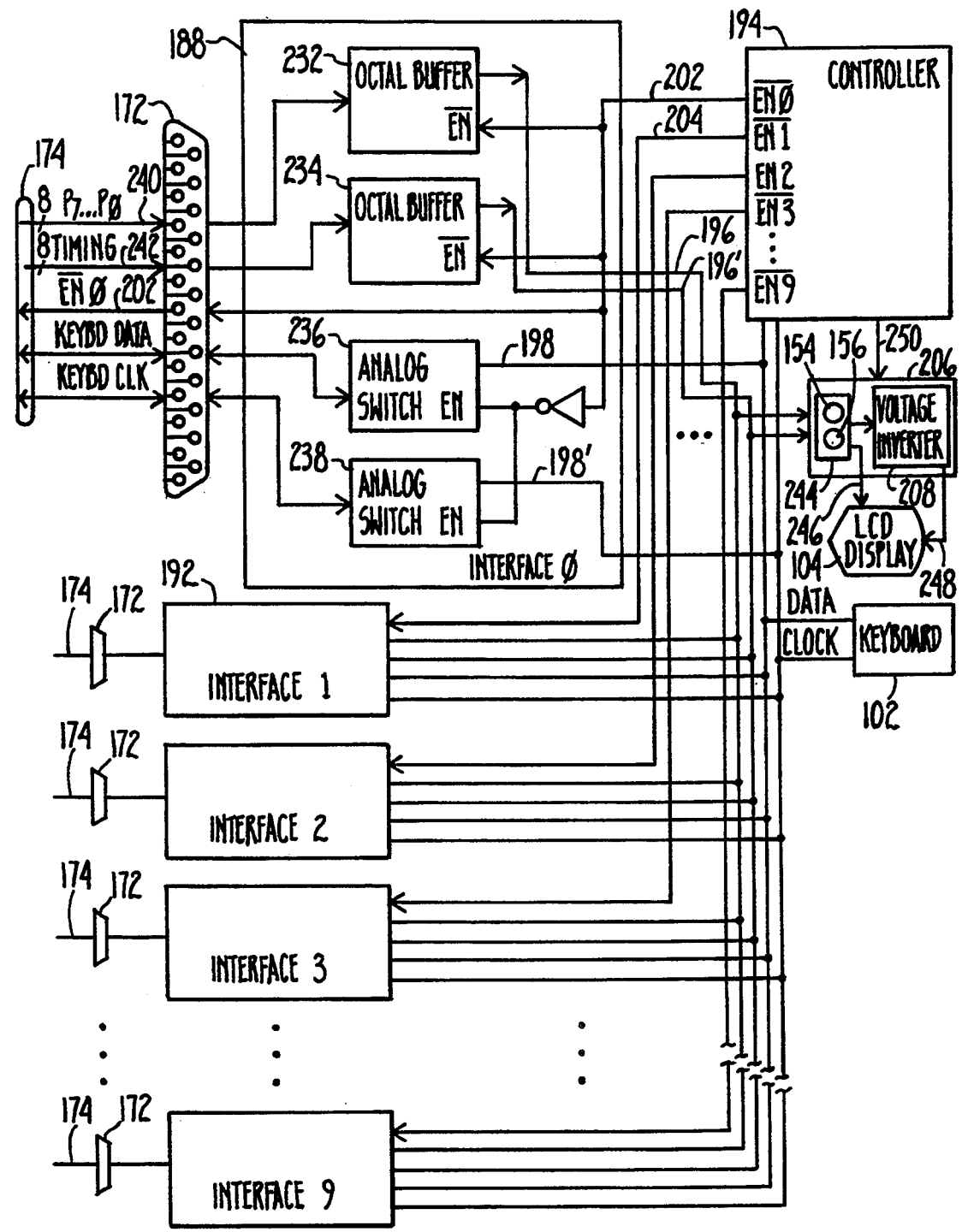
FIG. 10 illustrates a detailed electrical schematic of the monitoring unit 100 of the present invention showing details of the discriminator interface and display controller.

FIGS. 9 and 10 illustrate details of the computer-0 182, computer interface-0 186 and the discriminator interface-0 188 shown in FIG. 8. The details of these interfaces are shown and described hereinbelow. These interfaces are exemplary of the other interfaces (i.e. interface-1 through interface-9) in the system. One skilled in the art will recognize that the function and operation of the other interfaces and computers in the system operate identically to those described hereinbelow.

Referring now to FIG. 9, an electrical schematic diagram of the computer-0 182 and its related computer interface-0 186 is shown. As shown in FIG. 9, the computer typically has a microprocessor 210. The microprocessor 210 performs functions related to the application it is designed to accomplish. At certain times during system operation, for example during a system fault or failure condition, the computer 182 requires monitoring. In order to communicate with the monitoring unit 200 via the display 104, the computer-0 182 has a display controller 212 and a video dynamic random access memory (DRAM) 214. The computer-0 182 also has a video clock generator 216 which generates clock signals necessary to drive the display 104. The display controller 212 converts data in the video DRAM 214 into signals which drive a liquid crystal display. The display controller 212 produces the necessary signals to drive the display 104 on the monitoring unit 100.

In the preferred embodiment, the display controller 212, the video DRAM 214 and the video clock generator 216 are implemented with standard integrated circuits. For example, the display controller 212 is an LCD/CRT Graphics Controller, available from Trident, Mountain View, Calif., manufactured as Part No. TLCD9100B. The video DRAM 214 is implemented with four 256×4 bit DRAMS available from Toshiba of Japan, manufactured as Part No. TC514256APL-80. The video clock generator 216 is implemented with a video clock generator integrated circuit, available from X, manufactured as Part No. TCK9002, available from Trident, Mountain View, Calif. As shown in FIG. 9, the computer-0 182 also has a keyboard interface 218. The keyboard interface 218 is a simple socket header which allows the keyboard data and clock signals to be communicated with the microprocessor 210. The keyboard interface 218 is interconnected with two analog switching devices 220 and 222 positioned in the computer interface-0 186. The analog switches 220 and 222 are enabled by an enable signal EN0 202 produced by the discriminator controller 194 (shown in FIGS. 8 and 10). The enable signal EN0 202 is a logically low value when it is asserted true by the discriminator controller 194. Therefore, the enable signal EN0 202 is inverted as shown in FIG. 9 because the analog switches 220, 222 are enabled when a logically high input is presented at their enable control inputs. When the enable control inputs of the analog switches 220, 222 are held to a logically high value, the analog switches 220, 222 are electrically closed and the keyboard data and clock signals are transmitted between the keyboard interface 218 and the monitoring unit 100 via the discriminator cable 174 (shown in FIG. 8).

The computer interface-0 186 also has two digital octal buffer/line-drivers 226, 228. The input lines of the octal buffers 226, 228 are connected to the display output lines of the display controller 212. The output lines of the octal buffers 226, 228 are connected to a DB-25 connector 230. The DB-25 connector 230 is connected to the monitoring unit 100 via discriminator cable 174 (shown in FIG. 8). The octal buffers 226, 228 are enabled by the control line EN0 202. When the control line EN0 202 is asserted true (logical low value) by the discriminator controller 194 (shown in FIG. 8), the octal buffers 226, 228 transfer the display signals on their input lines to their output lines. When the control line EN0 202 is asserted false (logical high value), the octal buffers 226, 228 produce a high impedance at their outputs. Therefore, when the buffers 226, 228 are disabled, they are electrically disconnected from the monitoring unit 100.

The octal buffers 226, 228 and the analog switches 220, 222 are implemented with standard integrated circuits. In the preferred embodiment, the octal buffers 226, 228 are implemented with two octal buffers and line drivers with 3-state outputs, available from Texas Instruments, Inc., and manufactured as Part No. SN74HCT244. The analog switches 220, 222 are implemented with one quadruple bilateral analog switch, available from Toshiba of Japan, and manufactured as Part No. TC74HC4066AP.

Thus, the computer interface-0 186 allows the computer-0 182 to interface with the monitoring unit 100 and the discriminator circuit 200 (shown in FIG. 8). The data which drives the display 102 is enabled onto the discriminator cable 174 whenever the discriminator circuit 200 drives the enable signal EN0 202 low. Similarly, the keyboard data and clock signals from the keyboard 102 are transmitted to the computer-0 182 whenever the discriminator circuit 200 drives the enable signal EN0 202 low. In this manner, each computer can be monitored by the monitoring unit 100 (shown in FIG. 8) by enabling the transmission of the display and keyboard signals from the selected computer onto the discriminator cable 174. At the same time, the discriminator circuit 200 ensures that the all other computers have their output signals disabled by keeping all of their enable control lines at a logically false (high) value.

Referring now to FIG. 10, an electrical schematic of the monitoring unit 100 of the present invention is shown. As can be seen by referring simultaneously to FIGS. 8 and 10, the discriminator interface-0 188 interfaces the monitoring unit 100 with the computer-0 182 via the DB-25 connector 172 and the discriminator cable 174 (shown in FIG. 8). Similarly, the discriminator interface-1 192 interfaces the monitoring unit 100 with the computer-1 184 via the DB-25 connector 172 and the discriminator cable 174.

The discriminator interface-0 188 is comprised of two octal buffers 232, 234 and two analog switches 236, 238. The discriminator interface-0 188 functions and is enabled similarly to the computer interface-0 186 (shown in FIG. 8). For example, the discriminator interface-0 188 is enabled whenever the EN0 202 control line is asserted to a logically true value by the discriminator controller 194. Similarly, the discriminator interface-1 192 is enabled whenever the EN1 204 control line is asserted to a logically true value by the discriminator controller 194. As described in more detail hereinbelow with reference to FIG. 11, the discriminator controller 194 ensures that the discriminator interfaces (e.g. 188, 192) are enabled in a mutually exclusive manner. At any given point in time, only one discriminator interface is enabled by the discriminator controller 194. Therefore, at any given time, only one discriminator interface will produce display and keyboard data signals at their respective DB-25 connectors 172 for transmission to the selected computer via the discriminator cables 174.

As shown in FIG. 10, the two analog switching devices 236, 238 of the discriminator interface-0 188 are connected to the keyboard 102 data signal line 198 and the keyboard 102 clock signal line 198'. The keyboard data and clock signals are transmitted to the DB-25 connector 172 whenever the analog switches 236, 238 are enabled by the discriminator controller 194. The analog switches 236, 238 are enabled by the enable signal EN0 202 produced by the discriminator controller 194. The enable signal EN0 202 is a logically low value when it is asserted true by the discriminator controller 194. Therefore, the enable signal EN0 202 is inverted as shown in FIG. 10 because the analog switches 236, 238 are enabled when a logically high input is presented at their enable control inputs. When the enable control inputs of the analog switches 236, 238 are held to a logically high value, the analog switches 236, 238 are electrically closed and the keyboard data signal 198 and the keyboard clock signal 198' are transmitted between the keyboard 102 and the DB-25 connector 172. The keyboard signals are transmitted to the computer interface-0 186 (shown in FIGS. 8 and 9) via the discriminator cable 174. Because the discriminator interfaces are enabled in a mutually exclusive fashion, the keyboard bus lines 198 for each discriminator interface are bussed together forming a common data bus 198.

The discriminator interface-0 188 also has two digital octal buffer/line-drivers 232, 234. The input lines of the octal buffers 232, 234 are connected to the display data and timing signals produced by the display controller 212 (shown in FIG. 9 and transmitted to the DB-25 connector 172 via the discriminator cable 174. The output bus lines 196 of the octal buffers 232, 234 are connected to the display control 206 which drives the display 104. The octal buffers 232, 234 are enabled by the control line EN0 202. When the control line EN0 202 is asserted true (logical low value) by the discriminator controller 194, the octal buffers 232, 234 transfer the display signals on their input lines to their output bus lines 196. When the control line EN0 202 is asserted false (logical high value), the octal buffers 232, 234 produce a high impedance on their output bus lines 196. Therefore, when the buffers 232, 234 are disabled, they are electrically disconnected from the display control 206, and some other discriminator interface will drive the display via the output bus lines 196. Because the discriminator interfaces are mutually exclusively enabled, all of their outputs are bussed together onto a common output bus 196.

The octal buffers 232, 234 and the analog switches 236 238 are implemented with standard integrated circuits. In the preferred embodiment, the octal buffers 232, 234 are implemented with two octal buffers and line drivers with 3-state outputs, available from Texas Instruments, Inc., and manufactured as Part No. SN74HCT244. The analog switches 236, 238 are implemented with one quadruple bilateral analog switch, available from Toshiba of Japan, and manufactured as Part No. TC74HC4066AP.

Thus, the discriminator interface-0 188 allows the monitoring unit 100 and the discriminator circuit 200 to interface with the computer-0 182 and the computer-0 interface 186 (shown in FIG. 8). The data which drives the display 102 is enabled onto the output bus 196 whenever the discriminator circuit 200 drives the enable signal EN0 202 low. Similarly, the keyboard data and clock signals 198 from the keyboard 102 are transmitted to the computer-0 182 whenever the discriminator circuit 200 drives the enable signal EN0 202 low. In this fashion, each computer can be monitored by the monitoring unit 100 by enabling the transmission of the display and keyboard signals between the selected computer and the monitoring unit 100. At the same time, the discriminator circuit 200 ensures that the all other discriminator interfaces are disabled by keeping all of their enable control lines at a logically false (high) value.

The display control and data signals produced by the display controller 212 (shown in FIG. 9) are driven onto the output bus 196 whenever the discriminator controller 194 drives the EN0 202 enable control to a logically true value. When the octal buffers 232, 234 are enabled, the octal buffers 232, 234 transfer the display control signals presented on the DB-25 connector 172 to the output bus 196. The output bus 196 therefore contains all of the signals necessary to drive the display and are input to the display control 206 described in more detail hereinbelow.

For example, in the preferred embodiment, the DB-25 connector 172 has display data signals, P(7..0) 240 which contain the binary pixel information for displaying eight pixels on the LCD display 104. The display data bits 240 are transferred from the DB-25 connector 172 to the display control 206 via the output bus 196 whenever the octal buffer 232 is enabled.

Similarly, the DB-25 connector 172 has display timing signals 242 which control the timing of the display control 206. In the preferred embodiment, the display 104 has a collection of pixels or dots which are arranged as 640 pixels in the horizontal direction and 480 pixels in the vertical direction. Each horizontal row of pixels is called a scan line. An entire screen of pixels is referred to as a frame. Therefore, the timing signals 242 includes a "Frame" signal which indicates when the display control 206 is to begin display of a new frame. The timing signals 242 also includes two Clock Pulse signals, "Clock Pulse 1" and "Clock Pulse 2." "Clock Pulse 1" indicates when the display control 206 must start a new scan line. "Clock Pulse 2" indicates when the display control 206 must input a new group of eight pixels as determined by the display data signals 240. Thus, "Clock Pulse 2" is repeated 80 times each scan line (640 pixels divided by 8 pixels per clock pulse) and "Clock Pulse 1" is repeated 480 times each frame (480 scan lines per frame). The frame is refreshed 85 times per second, or at an 85 Hz rate. The display timing signals 242 are transferred from the DB-25 connector 172 to the display control 206 via the output bus 196' whenever the octal buffer 234 is enabled.

In another preferred embodiment, the display timing signals 242 also contain Vcc and Vdd power control signals which are produced by the display controller 212 (shown in FIG. 9). These signals control the sequencing of power to the display control 206 and the LCD display 104. In some systems using the monitoring unit 100 of the present invention, the display 104 is the last peripheral to which power is applied. The Vcc and Vdd power control signals allow the selected computer to turn the display off when it is no longer in use by asserting a logical low value to the Vcc and Vdd control signals. These signals are also transferred from the DB-25 connector 172 to the display control 206 via the output bus 196' whenever the octal buffer 234 is enabled.

As shown in FIG. 10, the keyboard 102 communicates with the discriminator controller 194 via a keyboard clock line 198' and a keyboard data line 198. The keyboard signal lines 198 are connected to the DB-25 connector 172 whenever the analog switches 236, 238 are enabled. The keyboard data and clock lines are bi-directional signal lines. When the keyboard 102 has data to transmit, i.e. a human operator has depressed one of the keys on the keyboard 102, the keyboard 102 has a microsequencer (not shown) which reads the keyboard data line 198 to determine that it is held to a logically high level. If it is, the keyboard microsequencer begins to transmit data over the keyboard data line 198 synchronous to the keyboard clock signal asserted over the keyboard clock line 198'. The start and stop bits on the data line 198 are always logical low values. Parity of the keyboard data is calculated as even parity of the data bits presented on the keyboard data lines 198.

As shown in FIG. 10, the keyboard data and clock lines 198 are also directly connected to the discriminator controller 194. The discriminator controller 194 monitors the sequence of keystrokes provided by the human operator in order to determine which computer to select and enable for further monitoring. The function and operation of the discriminator controller 194 is described in more detail hereinbelow with reference to FIG. 11.

The display data and timing bus signals 196 are input to the display control 206 as shown in FIG. 10. The display control 206 performs the functions necessary to control the LCD display 104. As shown in FIG. 10, the display control 206 is comprised of the brightness/contrast board 244 and the voltage inverter 208. The brightness/contrast board 244 performs several functions. First, the brightness/contrast board 244, together with the voltage inverter 208, produces the approximately 300 VAC needed to drive the backlight of the LCD display 104. Second, the board 244 produces between +3 to −24 VDC which is necessary for contrast adjustment. Third, the board 244 provides simplified cabling for the display 104. Finally, the board 244 controls the brightness and contrast of the display 104 by varying the voltages applied to the display 104 according to the rotary positions of the contrast control knob 154 and the brightness control knob 156. The voltage inverter 208 provides the necessary AC voltages to drive the backlight of the display 104.

The brightness/contrast board 244 transfers the display data bus 196 and the display timing bus 196' to the display 104 over the display bus 246 using the display ribbon cable 129. In addition to transferring the display data and timing signals to the display 104, the board 244 also accepts a control line output of the discriminator controller 194. As shown in FIG. 10, the discriminator controller 194 has a control line 250 which blanks the display 104 when asserted. The blanking control line 250 is input to the display control 206. As described hereinbelow with reference to FIG. 11, the discriminator controller 194 dims or blanks the display 104 whenever there is inactivity on the keyboard 102 for a predetermined period of time. The blanking control line 250 facilitates the blanking of the display 104.

The brightness/contrast board 244 is comprised of a contrast control section and a brightness control section (not shown). The contrast control accepts a 5 VDC input and converts the 5 VDC to a signal between +3 VDC and −24 VDC. In the preferred embodiment, the contrast control section is implemented with a standard monolithic integrated circuit switching voltage regulator, available from Texas Instruments, Inc., manufactured as Part No. TL497AC. The switching voltage regulator produces a −24 VDC output, which is then varied using a potentiometer and transistor circuit. The potentiometer is responsive to the rotary position of the contrast control knob 154. The output of the potentiometer and transistor circuit is connected to the Vdd input of the LCD display 104 via the display bus 246 using the ribbon cable 129.

The brightness control section of the board 244 is implemented with a potentiometer, a transistor, two capacitors, and a resistor. The 5 VDC input to the brightness/contrast board 244 is used to generate an output voltage between 3 and 5 VDC. The output voltage of the brightness control section is provided as an input to the voltage inverter 208, which in turn generates the AC voltage required to drive the backlight behind the LCD display panel 104.

In the preferred embodiment, the voltage inverter 208 generates between 0 and 300 VAC depending upon the varying input voltage applied to it by the brightness control section. The input voltage of the voltage inverter 208 is varied by varying the potentiometer in the brightness control section. Similar to the contrast section, the potentiometer is responsive to the rotary position of the brightness control knob 156. The brightness control section produces between +3 VDC and +5 VDC, depending upon the rotary position of the brightness control knob 156. Therefore, by rotating the control knob 156, the input voltage to the voltage inverter 208 is varied between 3 and 5 VDC. The output voltage of the voltage inverter is varied accordingly between 0 VAC and 300 VAC, which in turn varies the brightness of the backlight of the display 104.

In the preferred embodiment, the voltage inverter 208 is implemented with a DC to AC inverter, available from Endicott Research Group, Inc., Endicott, N.Y., manufactured as Part No. E1191. The DC to AC inverter is specifically designed to power the Sharp LM64P80 LCD VGA display to a moderate brightness level from a +5 VDC input source. The output of the voltage inverter 208 is connected to the LCD display via display bus 248.

In addition to the several functions described above, the display control 206 also produces a 5 VDC power source required by the logic elements (not shown) contained within the display 104. The power source is transferred to the display 104 logic elements via the ribbon cable 129 and the display bus 246. The display control 206 also provides a facility for controlling the sequencing of this 5 VDC power source to the display 104. As described hereinabove with reference to the display timing signals, the display timing signals 242 also contain power control signals. When the power control signals are asserted true, the 5 VDC power source is produced by the display control 206 and transmitted to the display 104. However, when the power control signals are asserted false, the display control 206 turns power off to the display 104, and, in effect, blanks the display. This feature may be used in conjunction with the blanking control line 250 which is asserted by the discriminator controller 194 whenever the display 104 requires blanking. In the preferred embodiment, the power control feature is implemented with a standard packaged Dual N-channel enhancement mode MOS-FET device, available from Siliconix, Inc., manufactured as Part No. SI9956DY.

Figure 11:
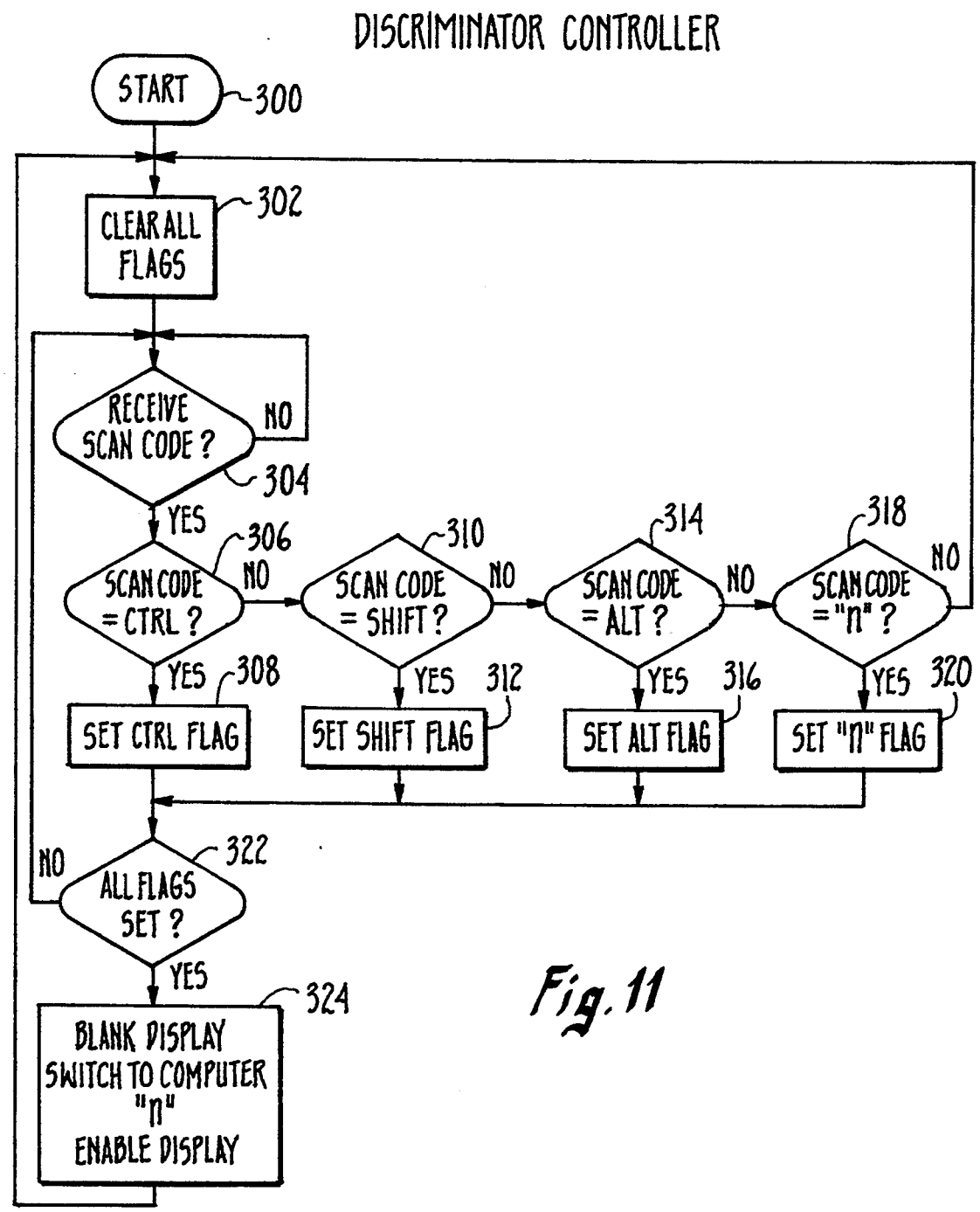
FIG. 11 shows a flow diagram for the top-level function and operation of the controller of the monitoring unit of the present invention.

FIG. 11 illustrates a flow diagram for the top-level function and operation of the discriminator controller 194 shown in FIGS. 8 and 10 called "discriminator controller." In one presently preferred embodiment, the discriminator controller flow diagram is implemented using Intel, Inc. 8048 Assembly language which is programmed into an EPROM located within the Intel, Inc. 8048 8-bit micro-controller located in the discriminator circuit 200. The 8048 assembly language is programmed into the 8048 device using an AllPro Programmer, available from Logical Devices, Inc. However, one skilled in the art of computers will recognize that many other computer languages and other controllers and micro-sequencers, including pluralities of each, may be used to achieve the same result.

Referring now to FIG. 11, the discriminator controller begins execution at a start state 300 upon power-up of the monitoring unit 100. Moving to a state 302, the discriminator controller 194 clears a series of flags associated with keystrokes entered on the keyboard 102 (shown in FIGS. 1, 2, 4, 5, 8 and 10). Next, at a decision state 304, the discriminator controller 194 reads the keyboard data input lines 198 (FIG. 10) to determine whether a scan code has been generated by the keyboard 102 (FIG. 10). The keyboard 102 generates a scan code every time a new key is depressed by the human operator. Each keystroke generates a unique scan code. If a keystroke has been entered by the operator, a scan code will be detected by the discriminator controller 194 (FIG. 10), and the discriminator controller will proceed to a state 306. If a scan code is not detected, the discriminator controller will remain in state 304 indefinitely until a scan code is entered.

Once the operator depresses a key and the keyboard 102 generates a scan code, the controller 194 determines whether the human operator has entered the correct sequence of keys necessary to select a computer for monitoring. In the preferred embodiment, in order to select a computer for monitoring, the operator must depress and hold, in any order, the CONTROL, ALT and SHIFT keys on the keyboard 102, followed by a numbered key. The numbered key, 0 through 9, will indicate which computer the controller 194 should enable for monitoring.

Therefore, after the operator depresses a key on the keyboard 102, a scan code is generated by the keyboard 102, and the controller moves to the state 306. In the state 306, a determination is performed by the controller 194 whether the operator has depressed the CONTROL key on the keyboard 102. If the CONTROL key was depressed, the controller moves to a state 308 where a flag representing the CONTROL key is set. If the CONTROL key was not depressed, the controller moves to a state 310 and performs a determination to check whether the operator depressed the SHIFT key on the keyboard 102. If the SHIFT key was depressed, the controller moves to a state 312 where a flag representing the SHIFT key is set. If the SHIFT key was not depressed, the controller moves to a state 314 and performs a determination to check whether the operator depressed the ALT key on the keyboard 102.

If the ALT key was depressed by the operator, the controller moves to a state 316 where a flag representing the ALT key is set. If the ALT key was not depressed, the controller moves to a state 318 and performs a determination to check whether the operator depressed a numbered key on the keyboard 102. If a numbered key was depressed by the operator, the controller moves to a state 320 where a flag is set which indicates that a numbered key was depressed.

After the controller has moved to any one of the flag setting states, 308, 312, 316, or 320, the controller 194 moves to a state 322 where a determination is made whether all of the flags, SHIFT, ALT, CONTROL, and N, have been set. If one of the flags associated with these keys on the keyboard 102 have not been set, the controller 194 moves back to the decision state 304 and awaits indefinitely for a new scan code from the keyboard 102.

However, if all of the flags have been set, the controller 194 moves to a state 324. At the state 324, the controller 194 blanks the display 104 via the blank control line 250 (shown in FIG. 10). The controller 194 then asserts the enable control line of the selected computer corresponding to the numbered key N entered by the operator. In the preferred embodiment, the respective enable control line (e.g. EN0 202, EN1 204) is driven to a logical low value, which enables the corresponding discriminator interface (e.g. discriminator interface-0, FIG. 10) and its related computer interface as described hereinabove with reference to FIGS. 8–10. Once the interfaces are enabled by the controller 194, the controller enables power to the display 104 via display control 206.

After enabling the display 104, the controller 194 moves back to the state 302, clears all of the flags, and moves to the decision state 304. At the decision state 304, the controller awaits the generation of new scan codes. The controller then monitors the scan codes, checking for the SHIFT, CONTROL, ALT, N sequence of keystrokes necessary to select a new computer for monitoring. The controller awaits the proper keystroke sequence, enabling the new selected computer as described above if the proper sequence is entered by the human operator.

As described hereinabove, another preferred embodiment of the monitoring unit 100 uses a keypad or rotary switching element to allow the operator to select a new computer for monitoring. The keypad 124 is shown in FIGS. 1, 2 and 4. In this preferred embodiment, the discriminator controller 194 monitors the input from the keypad 124 or rotary switch to determine which computer to enable for monitoring. The flow diagram for the controller using a keypad for computer selection is similar to that shown in FIG. 11. Instead of scanning a keyboard for the proper keystroke sequence, the controller scans the keypad 124. In all other ways, the controller 194 behaves as described hereinabove with reference to FIG. 11.

In addition, as described hereinabove with reference to FIG. 10, the controller 194 also blanks the display 104 whenever the keyboard 102 is inactive for a predetermined period of time, in the preferred embodiment, this period of time is about 5 minutes. Therefore, when the controller has been in the state 304 as shown in FIG. 11 for the predetermined period of time, the controller leaves state 304 to blank the display 104 by asserting the blank control line 250 (FIG. 10) true, which in turn blanks the display 104.

Figure 12:
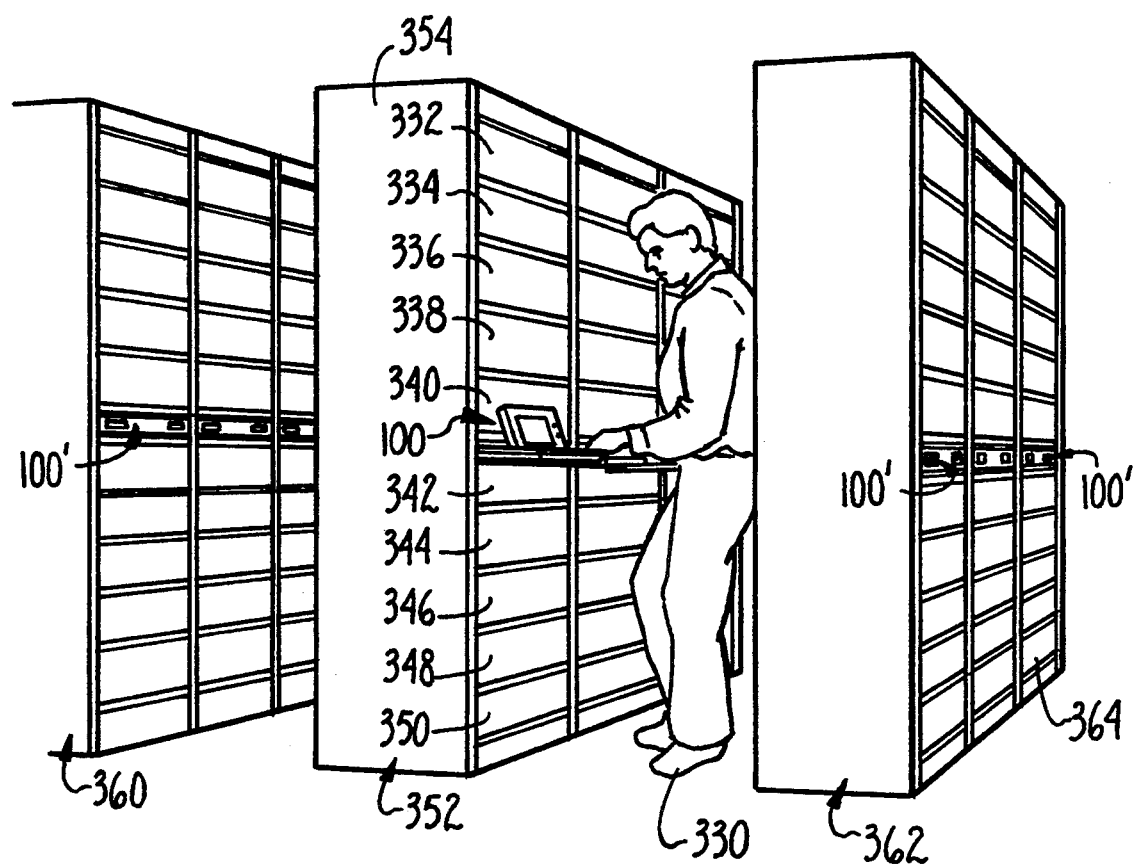
FIG. 12 illustrates the computer monitoring system of the present invention advantageously used by a human operator to selectively monitor computers mounted in electronic equipment racks having ten computers per rack.

Referring now to FIG. 12, a computer monitoring system is shown which advantageously uses the monitoring unit 100 of the present invention. As shown in FIG. 12, a human operator 330 is standing before a computer monitoring system 352 which has the monitoring unit 100 of the present invention slidably extended from within the monitoring system 352. The computer monitoring system 352 shown in FIG. 12 comprises the monitoring unit 100, ten computers 332, 334, 336, 338, 340, 342, 344, 348, and 350, stored within an equipment rack 354.

As shown in FIG. 12, the human operator 330 can easily monitor the ten computers 332-350 in the rack without moving from the front of the monitoring system 352. As shown in FIG. 12, the monitoring device 100 is preferably slidably mounted within the monitoring system at a height which is easily accessed by the human operator 330. Preferably, the monitoring device 100 is mounted at a height which is between the average waist-height and the average shoulder-height of the human operator 330. Typically, this height is between 4 and 5 feet from the bottom surface of a rack 354. In an alternative embodiment, the monitoring device 100 is preferably slidably mounted within the equipment rack 354 within approximately 10 retma units, plus or minus, of the middle vertical height of the rack 354.

FIG. 12 shows several other monitoring systems, e.g. 360, 362, and 364. Each of the monitoring systems 360, 362, and 364 have monitoring devices 100' shown fully inserted within the monitoring systems. As shown in FIG. 12, the monitoring devices 100' occupy very little vertical rack space (1 retma unit) in relation to the vertical rack space occupied by the computers. Because of the low profile nature of the monitoring device 100 of the present invention, the vertical rack space may virtually be completely occupied with computer equipment rather than with monitoring devices.

Thus, the present invention provides a simple, easy to use, inexpensive apparatus for monitoring computer equipment within an electronic equipment rack.

Where the present invention has been described with respect to specific embodiments thereof, it will be understood that various changes and modifications will be suggested to one skilled in the art and it is intended to encompass such changes and modifications as fall within the scope of the claims. Therefore, the scope of the present invention is not limited to the embodiments described herein, but rather the scope of the present invention is defined by the claims.

We claim:

1. A computer monitoring device for selectively monitoring a plurality of computers mounted within a computer equipment rack, comprising:

a base housing having a front partition and a rear partition, wherein the base housing is slidably mounted within an opening in the equipment rack so that the base housing can be substantially recessed in the opening;

a keyboard located in the front partition of the base housing, wherein the vertical height of the keyboard allows the base housing to be recessed into the opening in the equipment rack;

a display housing pivotably connected to the base housing in a configuration such that the display housing is rotatably moveable from a collapsed position to an erected position;

a flat panel display positioned in the display housing so as to be viewed by a viewer when the housing is in the erected position and, when the housing is in the collapsed position, the vertical height of the display and the display housing allows the base housing to be recessed into the opening in the equipment rack; and a discriminator, responsive to a selector input device, for selecting one of the plurality of computers for monitoring, wherein the discriminator operatively connects the keyboard and the display to a computer selected by the selector input device.

2. The computer monitoring device defined in claim 1, wherein the flat panel display comprises a liquid crystal display.

3. The computer monitoring device defined in claim 1, wherein the flat panel display comprises a color liquid crystal display having a passive or active matrix.

4. The computer monitoring device defined in claim 1, wherein the base housing has a maximum vertical height of 1.75 inches.

5. The computer monitoring device defined in claim 4, wherein the display housing when in the collapsed position, the keyboard, and the discriminator do not exceed the maximum vertical height of the base housing.

6. The computer monitoring device defined in claim 1, wherein the selector input device is the keyboard.

7. The computer monitoring device defined in claim 1, wherein the selector input device is a keypad.

8. The computer monitoring device defined in claim 1, wherein the selector input device is a rotary switch.

9. The computer monitoring device defined in claim 1, wherein the discriminator comprises a micro-controller operatively connected to a plurality of computer interfaces and a plurality of discriminator interfaces, the computer interfaces operatively connected the plurality of computers within the rack, the discriminator interfaces electrically connected to the computer interfaces, and wherein the discriminator operatively connects the keyboard and the display to the selected computer by enabling the computer interface connected to the selected computer and by enabling the discriminator interface connected to the selected computer.

10. The computer monitoring device defined in claim 1, wherein the computer equipment rack is an EIA RS-310 standard nineteen-inch equipment rack.

11. The computer monitoring device defined in claim 1, wherein the base housing is slidably mounted within the equipment rack using telescoping slides mounted to the sides of the base housing, wherein the slides are shaped to fit within mounting slides mounted within the sides of the equipment rack.

12. The computer monitoring device defined in claim 1, wherein the keyboard comprises a PC-AT compatible keyboard.

13. The computer monitoring device defined in claim 1, wherein the keyboard is removably mounted to the front partition of the base housing.

14. A computer monitoring system for selectively monitoring a plurality of computers mounted within a computer equipment rack, comprising:

a storage housing, slidably mounted within the equipment rack, having a front partition adjacent to a rear partition, a keyboard positioned in the front partition of the storage housing, a display pivotably connected to the storage housing in a configuration such that the display is rotatably moveable from an erected position to a collapsed position, wherein the display has a vertical height in its collapsed positioned which allows the storage housing to be slidably recessed into an opening in the computer equipment rack;

a selector input device for selecting one of the plurality of computers for monitoring; and a discriminator, responsive to the selector input device, for operatively connecting the keyboard and the display to the selected computer.

15. The computer monitoring system defined in claim 14, wherein the storage housing has a maximum vertical height of 1.75 inches.

16. The computer monitoring system defined in claim 15, wherein the display, when in the collapsed position, and the keyboard do not exceed the maximum vertical height of the storage housing.

17. The computer monitoring system defined in claim 14, wherein the plurality of computers comprises at most 10 computers.

18. The computer monitoring system defined in claim 14, wherein the storage housing is mounted within the equipment rack at a height of no less than 3 feet from a bottom of the rack and no greater than 5 feet from the bottom of the rack.

19. The computer monitoring system defined in claim 14, wherein the storage housing is mounted within the equipment rack at a height which is between an average waist-level height of an operator and an average chest-level height of an operator.

20. The computer monitoring system defined in claim 14, wherein the storage housing is mounted within the equipment rack at a height which is within 10 retma units of the middle of the rack.

21. The computer monitoring system defined in claim 14, wherein the selector input device is the keyboard.

22. The computer monitoring device defined in claim 14, wherein the selector input device is a keypad.

23. The computer monitoring device defined in claim 14, wherein the selector input device is a rotary switch.

24. The computer monitoring system defined in claim 14, wherein the discriminator comprises a micro-controller operatively connected to a plurality of computer interfaces and a plurality of discriminator interfaces, the computer interfaces operatively connected to the plurality of computers within the rack, the discriminator interfaces electrically connected to the computer interfaces, and wherein the discriminator operatively connects the keyboard and the display to the selected computer by enabling the computer interface connected to the selected computer and by enabling the discriminator interface connected to the selected computer.

25. A computer monitoring device for monitoring a plurality of computers mounted within a computer equipment rack, comprising:

a storage housing having a front partition and a rear partition wherein the storage housing is slidably mounted in an opening within the computer equipment rack;

a flat panel display mounted in a display housing, the display housing pivotably coupled to the storage housing between an erected position and a collapsed position, wherein the flat panel display is dimensioned in the collapsed position to allow the storage housing to be positioned into an opening in the computer equipment rack;

a keyboard removably mounted to the front partition of the storage housing; and a discriminator, mounted in the rear partition of the storage housing and electrically connected to the keyboard and the display, having a micro-controller responsive to the keyboard for selecting one of the plurality of computers to be monitored, the discriminator including a plurality of buffers and line drivers for operatively connecting to the selected computer to the display and the keyboard.

26. A computer monitoring system, comprising:
an electronic equipment rack for mounting computers wherein the equipment rack has a recessed opening;
a base housing having a first partition and a second partition, wherein a keyboard is positioned in the first partition and a display is mounted in the second partition so that the display can be moved between a first position and a second position wherein the display is dimensioned in the second position to allow the base housing to be recessed in the recessed opening in the electronic equipment rack;
a plurality of computers mounted within the rack; and
a monitoring device selectively operatively connected to the plurality of computers, wherein the monitoring device has a minimum vertical height of one retma unit.

27. The computer monitoring system of claim 26, wherein the monitoring device comprises a discriminator capable of selectively operatively connecting the plurality of computers to the keyboard and the display.

28. The computer monitoring system of claim 26, wherein the monitoring device is responsive to a selector input device.

29. The computer monitoring system of claim 27, wherein the discriminator is responsive to a selector input device.

30. The computer monitoring system of claim 26, wherein the electronic equipment rack conforms to a standard EIA RS-310 19-inch rack.

31. A computer monitoring system, comprising:
an electronic equipment rack for mounting computers wherein the electronic equipment rack includes a recessed opening;
a plurality of computers mounted within the rack and
a monitoring device having a discriminator, a display and a keyboard contained in a base housing, wherein the discriminator is responsive to a selector input device for selecting one of the plurality of computers for monitoring, and wherein the discriminator operatively connects the selected computer to the display and the keyboard and wherein the display can be positioned in both a first position where the display can be viewed by a viewer and a second position where the vertical height of the display is less than the vertical height of the base housing thereby allowing the base housing to be recessed into the placed within opening in the electronic equipment rack.

32. The computer monitoring system of claim 31, wherein the monitoring device has a maximum vertical height of one retma unit.

33. A computer monitoring system, comprising:
an electronic equipment rack for mounting computers which includes a opening in a position within ten retma units of the middle of the rack;
a plurality of computers mounted within the rack;
a storage drawer, slidably mounted within the opening in the equipment rack having a keyboard removably mounted in the storage drawer and a display pivotably connected to the storage drawer in a configuration such that the display is rotatably moveable from an erected position to a collapsed position so that, when the display is in the collapsed position, the storage drawer can be slidably recessed into the opening in the equipment rack;
a selector input device for selecting one of the plurality of computers for monitoring; and
a discriminator having a plurality of computer interfaces, said computer interfaces having first inputs operatively connected to a plurality of discriminator interfaces and having second inputs operatively connected to the plurality of computers, wherein the discriminator is responsive to the selector input device, and wherein the discriminator enables the computer interface and the discriminator interface connected to the computer selected by the selector input device, and wherein the discriminator operative by connects the display and the keyboard to the selected computer.

* * * * *